United States Patent
Cook et al.

(10) Patent No.: US 9,203,369 B2
(45) Date of Patent: Dec. 1, 2015

(54) COMPOSITE ELECTROMAGNETIC ISOLATION FILTERS

(71) Applicant: octoScope Inc., Bolton, MA (US)

(72) Inventors: Ron Cook, Groton, MA (US); James Sozanski, Bolton, MA (US)

(73) Assignee: Octoscope Inc., Littleton, MA (US)

( * ) Notice: Subject to any disclaimer, the term of this patent is extended or adjusted under 35 U.S.C. 154(b) by 247 days.

(21) Appl. No.: 13/632,397

(22) Filed: Oct. 1, 2012

(65) Prior Publication Data
US 2014/0091874 A1    Apr. 3, 2014

(51) Int. Cl.
*H03H 7/01* (2006.01)
*H01P 1/203* (2006.01)

(52) U.S. Cl.
CPC . *H03H 7/01* (2013.01); *H01P 1/203* (2013.01)

(58) Field of Classification Search
CPC ....... H04B 3/28; H03H 1/007; H03H 1/0233; H03H 1/0007; H03H 7/01; H01F 2017/065; H05K 1/0233; H01P 1/203
USPC .................................................. 333/12, 175
See application file for complete search history.

(56) References Cited

U.S. PATENT DOCUMENTS

| | | | |
|---|---|---|---|
| 6,603,080 B2 * | 8/2003 | Jensen | 174/255 |
| 7,456,702 B2 | 11/2008 | Keefe et al. | |
| 7,791,430 B2 | 9/2010 | Keefe et al. | |
| 2002/0121943 A1 * | 9/2002 | Axelrod et al. | 333/182 |
| 2008/0284545 A1 | 11/2008 | Keefe et al. | |

FOREIGN PATENT DOCUMENTS

| | | |
|---|---|---|
| WO | WO0191291 A1 | 11/2001 |
| WO | WO 02080201 A1 * | 10/2002 |

OTHER PUBLICATIONS

ARC Technologies Inc., "Technical Data Sheet: WX-A010", www.arc-tech.com.

* cited by examiner

*Primary Examiner* — Robert Pascal
*Assistant Examiner* — Kimberly Glenn
(74) *Attorney, Agent, or Firm* — Intrinsic Law Corp.; Ibrahim M. Hallaj

(57) ABSTRACT

The present disclosure is directed to systems and methods for operating, designing, testing and verifying the performance of wireless communication devices. Specifically, the present systems and methods can passively attenuate unwanted electromagnetic interference (EMI) without degrading signal quality of predetermined frequency using a novel versatile module including a RF absorbing material in a composite medium surrounding the conducting signal lines. Utilizing varying permeability media, the present invention offer a robust platform to eliminate unwanted noise while maintaining a desirable control and power interfaces used for testing of wireless communication systems.

24 Claims, 20 Drawing Sheets

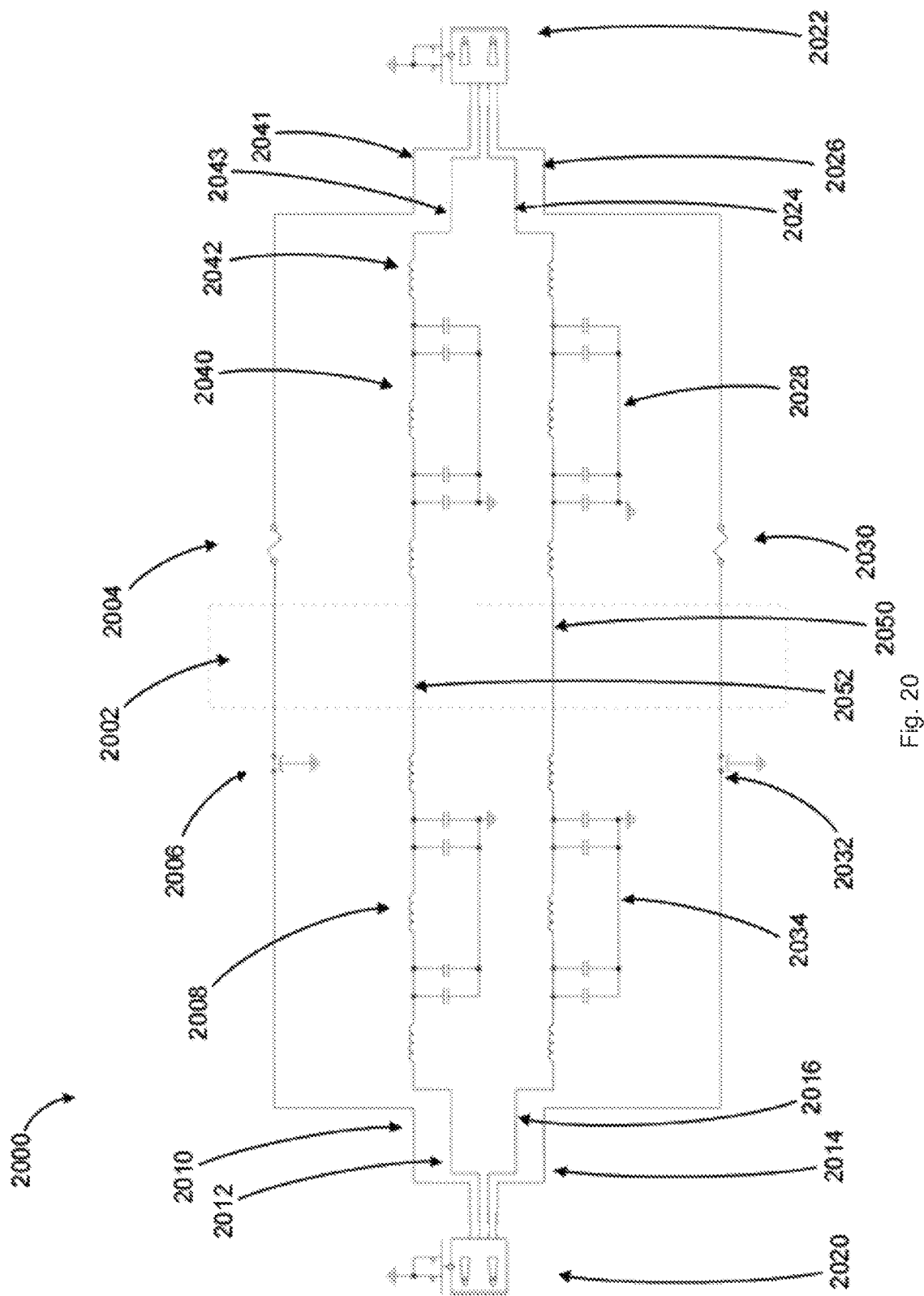

COMPOSITE ELECTROMAGNETIC ISOLATION FILTERS

TECHNICAL FIELD

The present application relates to testing of electromagnetic components, wireless communication devices, and arrays of same having electromagnetic emitters and/or receivers. More particularly, in certain embodiments, the invention relates to compact modules and systems, and related methods for the filtering of high frequency electromagnetic noise for the use in testing of aforementioned components.

BACKGROUND

Wireless communication has grown to encompass a huge variety of information transactions between electronic machines. These include cellular communications between hand-held units and base stations, wireless communications between peer devices or master-servant components, and even between components on a same device.

For reliable interoperability, wireless communications have been organized into known formats, generally referred to by the associated protocols, so that multiple parties can communicate effectively using compatible communication devices and methods. This encompasses communications between devices employing same communication protocols but made by different manufacturers in different parts of the world. In some respects, these protocols determine the allowable or preferred techniques for delivering and interpreting data communicated between a plurality of communication devices. In other respects, the protocols govern the way in which information is packaged for transmission over conducting or optical lines or over the air (OTA) in a wireless communication environment.

Present and forthcoming systems provide relatively compact enclosures for performing the above design and testing. The enclosures are preferably relatively mobile and small in size compared to typical existing over-the-air (OTA) testing facilities, which are usually room-sized or laboratory-sized and not mobile. The enclosures are also preferably provide isolation from RF, microwave and other electromagnetic interference so that the testing conducted within the enclosures is substantially performed without such interference.

In some aspects, the forthcoming enclosure systems are geometrically and operationally adaptable for a variety of applications and uses, while maintaining a high degree of electromagnetic isolation. To this end, filtering of ambient electromagnetic interference (e.g., from laboratory electronics or surrounding interfering radios) is desirable.

Various structures commonly known as "filters" are used for suppressing or attenuating, to a desired specification, electromagnetic waves impinging on and propagating through the filter, depending on the signal's or wave's constituent frequencies. The number and scope of fields of communication, entertainment, and industrial equipment and systems requiring electronic filters is essentially indefinable. Therefore, it will be understood that the example applications for the filter described herein are not limiting; the fields are presented to assist the person of ordinary skill better understand the present filter, and to make and use a filter in accordance with described herein, for either an application similar to the example application, or any other of a wide range of applications.

As described in the prior art, including that cited herein, textbooks, technical journals, and other publications embody a large knowledge base of filters, including their types, structures, guidelines for selection, methods of design, construction, and testing. Within this large existing knowledge base, it is also well known that problems exist in designing and constructing a "low pass" filter, i.e., a filter that maintains high speed data integrity in the passband while at the same time effectively rejecting common wireless frequencies (e.g. in the microwave range). Furthermore, filtering Ethernet interfaces with Power over Ethernet (PoE) according to the IEEE 802.3af standard, is especially challenging since the filter must combine high frequency passband together with high current tolerance, which is challenging for traditional LC based filters. High power LC components are used to support the power present in the PoE interface and can have parasitic responses that limit their effectiveness when it comes to rejecting high frequencies (e.g., microwave wireless frequencies).

There are known methods and structures directed to filtering unwanted noise having frequencies above about 400 MHz (e.g., USB signal passband and up to, e.g., 6 GHz Wi-Fi band). One example is a miniature thin film filter as reported by Vion et al., J. Appl. Phys. 77, 2519 (1995). Another example is a distributed thin film microwave filter reported by Jin et al., Appl. Phys. Lett. 70, 2186 (1997). Still another example is the Philips Thermocoax filter, as discussed in A. Zorin, Rev. Sci. Instrum. 66, 4296 (1995). In most cases these filters were first used to reduce noise in single electron tunneling experiments. Perhaps the simplest and easiest to fabricate "microwave" filter is the bulky metal powder filter. The metal powder filter was first discussed in more detail by Martinis et al., Phys. Rev. B 35, 4682 (1987) and subsequently developed and discussed in detail by others. See K. Bladh et al., Rev. Sci. Instrum. 74, 1323 (2003), and A. Fukushima et al., IEEE Trans. Instrum. Meas. 45, 289 (1997).

The metal powder filters known in the relevant art have a central conductor that is surrounded by metal powder or a metal powder/epoxy mixture. The filter attenuates an incoming electrical signal via eddy current dissipation in the metal powder. The known art teaches, however, that the central conductor is shaped into the form of a spiral to increase the attenuation. This does indeed increase the attenuation but, as observed by the present inventors, these spiral conductor metal powder filters cannot be designed to have a characteristic impedance near 50Ω at high frequencies. It has been identified that the physical design of known metal powder low pass filters creates what is technically a short at high frequencies, not 50Ω. In many high frequency applications, however, it is useful to employ a matched 50Ω impedance measurement setup. If low pass filters are used they are also 50Ω in this scenario on each line of a differential transmission pair with the total impedance being 100Ω.

Further work in this space is disclosed in U.S. Pat. Nos. 7,456,702 and 7,791,430, and Patent Pub. No. US 2008/0284545, which are collectively and generally limited to coaxial designs of low pass metal powder filters and do not lend themselves for flexible and modern applications of differential 100Ω feed-through filtering systems.

Other shortcomings observed in testing environments are the prevalence of ferrite-core chokes. They come in many shapes, sizes and names. Beads, chokes, dongles, toroids, inductors, bumps, clamps, blocks, cores, rings and are all passive low-pass filters. The geometry and electromagnetic properties of coiled wire over the ferrite bead result in a high resistive impedance mostly for high-frequency signals, attenuating high frequency electromagnetic interference (EMI)/radio frequency (RF) electronic noise. When frequencies escalate, using this "choke" method often results in the energy reflected back up the cable.

SUMMARY

As mentioned above, there is dearth of modular filters which offer both superlative isolation/noise attenuation while supporting common communications transmission lines, such as gigabit Ethernet with PoE according to IEEE 802.11af, USB 2.0, HDMI and other commercially used communications interfaces. Presently there are no low-loss, impedance matched, low pass filters with high frequency passband in a modular, variegated system. There exists a need, especially within the art of wireless test chambers, to filter out all high frequency noise which my bleed into a test chamber via the control and power input/output (I/O). For example, some test chambers utilize USB ports to monitor the testing conditions. Copper lines, such as USB, Ethernet or power, used for controlling or powering devices under test, can act as antennas bringing external interference into the test chamber. It has been observed that high frequency noise, >400 MHz, is attributable to USB or Ethernet electrical cabling entering the test chamber to communicate with the device under test.

Additionally, prior filter devices are not well suited for use in modern applications, e.g., in the context of RF development and test systems in a scalable, practical or efficient way. LC components required for effective high frequency attenuation, for example, will not stand up to high currents necessary to implement Power over Ethernet.

The present inventions related to new and improved systems and methods for operating, designing, testing and verifying the performance of wireless communication devices. Specifically, the present systems and methods can reliably augment testing of wireless communication modules within electronic products and devices, by increasing isolation and attenuating high frequency noise. This includes the ability to reliably and repeatably test the effectiveness of radio frequency (RF), 802.11, cellular, 3G, 4G/LTE, WiMax, Bluetooth, microwave and other electromagnetic receiver, transmitter and transceiver components.

In some aspects, the present invention describes a modular, versatile filter, permitting numerous input/output (I/O) configurations. The present invention allows for quickly changing a passive absorptive media, thereby giving the user the capacity to change frequency cutoff and degree of attenuation, in addition to other parameter which will be discussed later.

In other aspects, the present systems and methods permit more reliable, repetitive, and production scale testing of said wireless systems. In still other aspects, the present systems and methods permit the connective testing of modular testing equipment while providing improved isolation/attenuation of EMI/RF noise.

Particular embodiments are directed to An apparatus for mitigating electromagnetic interference, comprising a first strip of passive electromagnetically attenuating media; a second strip of passive electromagnetically attenuating media; and one or more electrical conductors extending substantially length of the first and second strip; said one or more electrical conductors disposed in between first and second strip.

Other particular embodiments are directed to an electromagnetically isolating test chamber system, a passive electromagnetic filter assembly that attenuates unwanted electromagnetic interference at or proximal to a portal penetrating into said test chamber, the filter assembly comprising a housing, including mechanical mounting points for mounting to the electromagnetic test chamber, and including at least a pair of apertures penetrating said housing; an electrical signal conductor, having a first end and a second end, that carries desired electrical signals along a length of said conductor between the first end of the signal conductor to the second end of the signal conductor; an electromagnetically-attenuating medium, comprising a composite of conducting particles embedded in a flexible substrate, substantially surrounding the signal conductor and substantially extending the length of said signal conductor between said first and second ends thereof; and a pair of electrical connectors, one at each end of said signal conductor, a first one of said connectors proximal to a first aperture in said housing and a second one of said connectors proximal to a second aperture in said housing; wherein said connectors are dimensioned, shaped and configured according to a standardized commercial specification and further adapted for mating to corresponding connectors according to said standardized commercial specification; and wherein said first housing aperture and first connector are suitably disposed on said housing to be in signal communication with components inside the test chamber, while said second housing aperture and second connector are suitably disposed on said housing to be in signal communication with components outside said test chamber, the filter assembly thereby being configured and arranged to provide selective signal passage through said conductor and said connectors, and to exclude unwanted electromagnetic interference from passing therethrough.

Still other particular embodiments are directed to a passive electromagnetic filter assembly, comprising a housing having at least a pair of apertures penetrating said housing; a filter support plate to support one or more passive filter components comprising a substantially planar plate supporting a pair of electrical connectors, one proximal to each of two opposing ends of said filter support plate, and supporting an electrical signal conductor; an electromagnetically-attenuating medium, comprising a composite of conducting particles embedded in a flexible substrate, disposed around the signal conductor but permitting the signal conductor to be coupled at respective opposing ends thereof to respective ones of said pair of electrical connectors; and a first isolation plate comprising a solid electromagnetically isolating slab disposed proximal to a first face of said filter support plate and including a first aperture for passage of a first of said pair of electrical connectors therethrough; and a second isolation plate comprising a solid electromagnetically isolating slab disposed proximal to a second face of said filter support plate, opposing the first face of said filter support plate, and including a second aperture for passage of a second of said pair of electrical connectors therethrough.

IN THE DRAWINGS

FIG. 20 illustrates an electrical circuit representation of a composite microstrip plus LC filter apparatus.

DETAILED DESCRIPTION

As mentioned above, the present inventions related to new and improved systems and methods for operating, designing, testing and verifying the performance of wireless communication devices. Specifically, the present systems and methods can reliably subdue unwanted noise in a highly variable module with the realm of wireless communication and electronic products and devices. This includes the ability to reliably and repeatably test the effectiveness of radio frequency (RF), 802.11, cellular, 3G, 4G/LTE, WiMax, Bluetooth, microwave disposed within electromagnetic receivers, transmitters and transceiver components, either individually and/or in a real or emulated network.

In some embodiments, the present systems provide relatively compact and versatile passive filter modules. The passive filter modules can be disposed between and/or connected to test enclosures. The enclosures are preferably relatively mobile and small in size compared to typical existing over-the-air (OTA) testing facilities, which are usually room-sized or laboratory-sized and not mobile.

In other embodiments, the passive filter modules are an integral part of the test enclosure. The enclosures are also preferably provide isolation from RF, microwave and other electromagnetic interference so that the testing conducted within the enclosures is substantially performed without such interference. However, within the scope of the present invention, the addition of passive modular filter ensures that EMI from interfering radios or from the test/monitoring equipment does not enter the test chamber.

At minimum, the present passive filter modules and the methods for using the same allow for better design of electromagnetic wireless communication systems, components, and networks. Also, the present systems and methods permit more reliable, repetitive, and production scale testing of said wireless systems.

Figure 1:
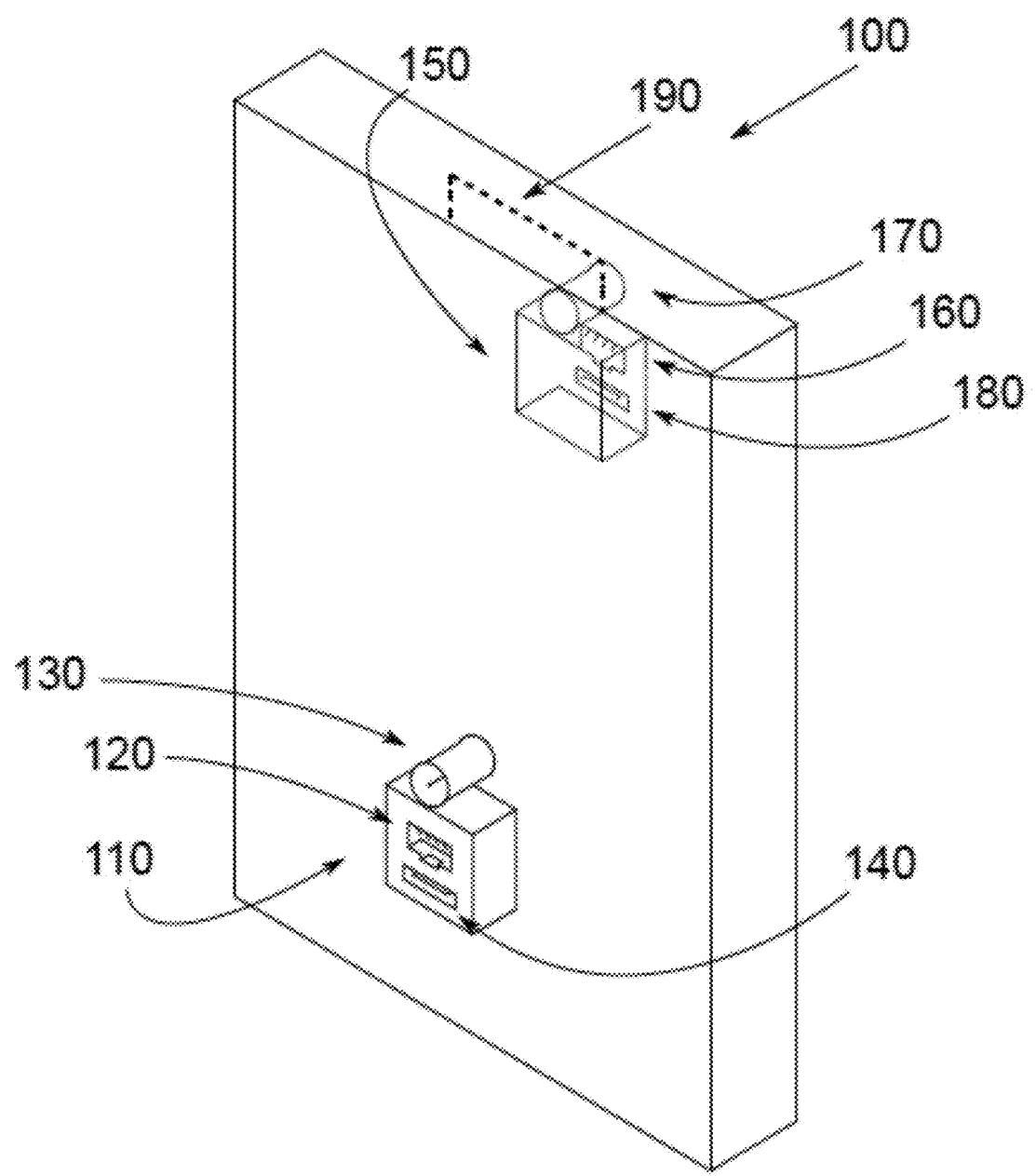
FIG. 1 illustrates an exemplary view of a modular electromagnetically isolated filter, as viewed isometrically.

FIG. 1 illustrates an isometric view of an exemplary passive filter module 100 that can be used for the above purposes to attenuate and/or eliminate high frequency noise in the context of testing electromagnetic devices (e.g., the performance of transmitting and/or receiving components and antennas). Such a module is herein referred to as a electromagnetically isolated passive filter though it is to be understood that filter EMI/RF within the scope of testing an apparatus or component is but one use of the present system. Other purposes and uses include verification, design, analysis, scientific experimentation, proving or confirming compliance, certification, adaptation manipulation, mass production or production line testing, and others.

Passive filter module 100 is comprised by a housing 110, which may be formed of one or more individual housing parts, which will be described in greater detail later. In the embodiment shown, the housing 110 is mechanically coupled structure to make up and enclose the filter components. Housing 110 and all constituent components are made of material that substantially isolate the electromagnetic environment and are constructed of electromagnetically opaque materials (e.g., metal, alloy, or other conducting solids such as steel in some embodiments).

In the present embodiment, this is performed by construction using a material with very high conductivity, sigma, with a thickness greater than the skin depth, delta, for a given electromagnetic wave. As is known in the art, a material with an infinite conductivity reflects all electromagnetic waves impinge its surface, evanescence notwithstanding. In practice, the purpose of the highly conductive material prevents electromagnetic interference from entering the test chamber.

In some embodiments, interior surface (depicted later in disclosure) of housing 110 of the compartments of the test system may be made substantially or partially non-echoing so as to absorb or minimize the internal reflection of electromagnetic waves incident upon said internal walls. One or more embodiments, this is accomplished by lining the interior with a lossy material of complex impedance. As known in the art, the real part of a refractive index (as in the optical bandwidth of the electromagnetic spectrum) bestows boundary conditions governing refection and transmission, while the imaginary part imparts absorption for a given wavelength. Analogous parameters are known in the RF regime: attenuation constant, loss tangent in dielectrics, etc.

In practice, an operator (human or robot machine) interfaces with the passive filter module by connecting a device or network which is to be electrical communication to the I/O panel which comprises a variety of different ports, connections, and protocols, which can include any of those that are known in the industry or similar interfaces and connectors that become known.

Referring to FIG. 1, passive filter module includes coaxial connector 130, Ethernet connector 120, and USB port 140. In an embodiment, coaxial connector 130 is an SMA connector. While in other embodiments, coaxial connector 130 is a standard 500 medium, ubiquitously used in the cable TV/high speed internet art. While a myriad of different connections may be chosen within the scope of the present invention, passive filter module 100 includes standard Ethernet connector 120 (e.g., RJ-45, etc.) and a standard USB 2.0 port 140 for making electrical communication signals. Signals may be passed unidirectionally or bidirectionally through the components described herein.

Signals in electrical communication with passive filter module 100 typically conform to industry standards, such as Ethernet or USB. That is, passive filter module 100 comprises coaxial connector 170, Ethernet connector 160, and USB port 180, disposed on or near output panel 150. Again, all protocols, industry standards, and connector types referenced herein are demonstrative, as any may be used in any combination.

In the present embodiment, all I/O interfaces are internally in electrical communication with one another, respectively, by a conductive material, such as a wire or printed circuit board (PCB) trace elements. Conductors are disposed close to partially conductive electromagnetic suspension material 190, which will be described in greater detail later in the present application.

In one or more present embodiments, in the context of wireless testing, passive filter module 100 is attached to or in electrical communication with wireless testing chambers, in production or research and development laboratory environments to suppress the unwanted high frequency signals and noise that can interfere with wireless test signals being generated inside the isolation chamber.

In basic operation, the passive filter module 100 allows for electromagnetic communication between a device inside the wireless test chamber and a controller outside the test chamber.

Figure 2:
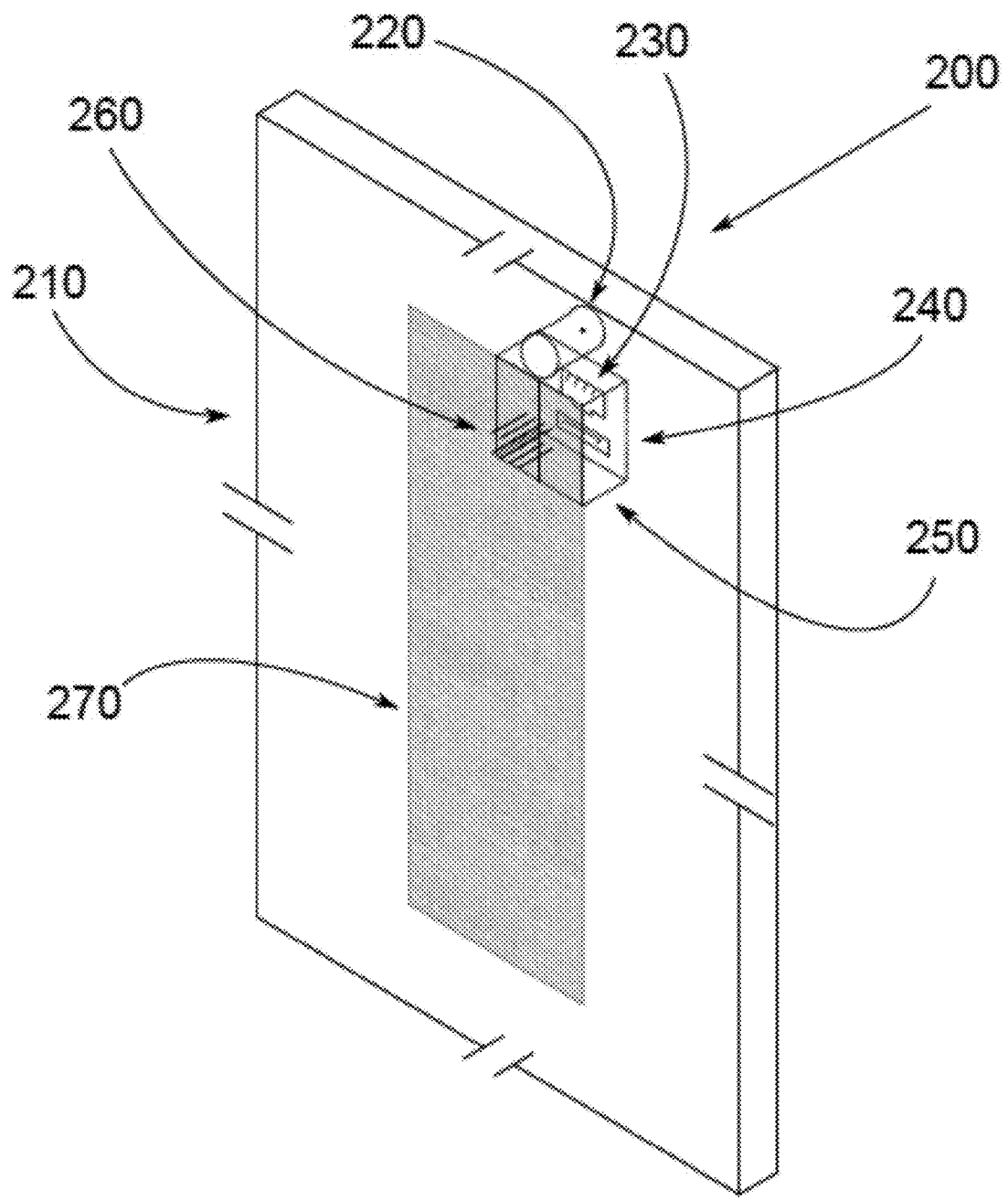
FIG. 2 illustrates an cross-section view of a modular electromagnetically isolated filter, as viewed isometrically.

FIG. 2 illustrates a cross-section of an exemplary passive filter module 200 depicted in an isometric perspective found in one or more embodiments of the present invention. Passive filter module 200 includes an electromagnetic isolating housing 210, in accordance with previous description, which has been cut lengthwise for illustrative purposes. Connection panel 210 includes coaxial connector 220, Ethernet connector 230, and/or USB port 240.

Connection panel 210 is in electrical communication with conductors extending through electromagnetic isolating housing 210 via pin layout 260. Disposed close to the conductors, which deliver electrical signal between the two connectors is a layer of suspension media 270. Suspension media 270 performs as high frequency absorber while not impeding signals of lower frequencies—those lower than a predetermined cutoff.

Suspension media 270 is manufactured by suspending (i.e., as a colloid) conductive or semi conductive particles which exhibit a predetermined magnetic behavior in an epoxy. Density and disparately sized particles may be change for a particular application. That is, density, particle size, and suspension media 270 may all be tailored to suit frequency and attenuation specification, in accordance with its $\mu'$ and $\mu''$.

In some embodiments, suspension media strips may easily be changed out. In others embodiments, electrical conductor pathways may be altered by a switching or controller mechanism in order for the signal to maintain proximity to the suspension media for greater distances. This affords for greater attenuation characteristics which offering versatility for the user.

In other embodiments within the scope of the present invention, arrays can be configured in a variety of arrangements, such as, side by side, front to back, etc. Sometimes, it is preferred to configure passive filter modules for the shortest electrical communication pathway, where input/output (I/O) panels are disposed to face the I/O panel of an additional passive filter module and/or wireless test chamber.

Figure 3:
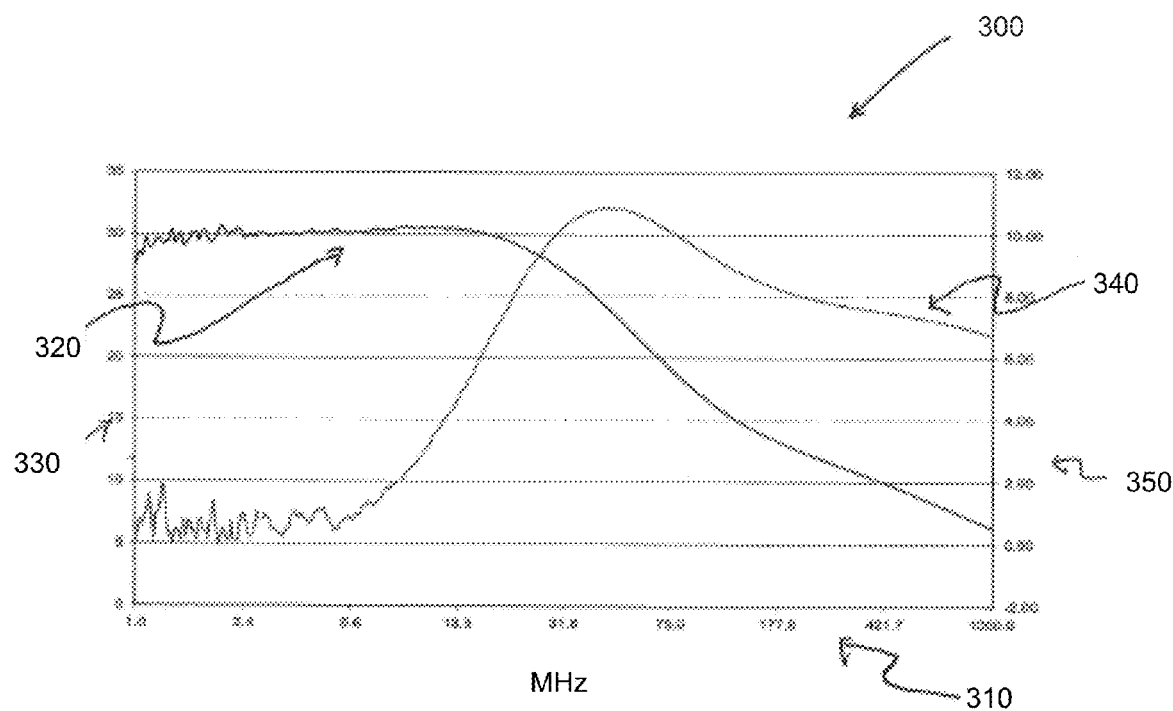
FIG. 3 depicts a graphic illustration of the performance of a typical p-absorbing material.

FIG. 3 depicts an exemplary plot of electrical data (permeability) 300 depicting the performance of a $\mu$-absorbing material, in an embodiment of the present invention. As can be appreciated by those skilled in the art, permeability ($\mu$) can be decomposed into real ($\mu'$) and imaginary ($\mu''$) parts each conferring characteristic behavior affecting interacting electromagnetic waves. Specifically, $\mu'$ affects boundary conditions as a function of frequency. The imaginary part of permeability, $\mu''$, dictates the rate of absorption as a function of frequency.

Turning to FIG. 3, $\mu'$ 320 is charted with relative values 330 on the major axis as a function of frequency 310 on the minor axis. $\mu''$ 340 is also plotted with relative imaginary values 350 on the secondary, major axis as function of frequency 310. As can be observed, $\mu''$ 340 drops precipitously at around 31.6 MHz. This confers an attenuation of the electromagnetic signal with increased absorption as frequency is increased.

As to the transfer function of the filter, Ethernet passband ends at about 100 MHz. USB passband ends at about 400 MHz. Rejection should start beyond the passband and extend up to about 6 GHz. The filter should pass the frequencies at which Ethernet and USB operate and reject frequencies at which wireless devices operate. The rejection should therefore start at 700 MHz and extend to about 6 GHz, thus eliminating the common wireless signal frequencies, but still passing the Ethernet and USB data signals to the devices under test (DUTs) inside the chamber. Other interfaces to the DUTs inside the chamber include HDMI, serial and other interfaces.

Aspects of the present feed-through filter in some embodiments address the issues of: (1) low loss in the passband, extending up to 400 MHz, (2) high loss in the reject band from 700 MHz to about 6 GHz and (3) tolerance of high current useful for PoE supply. Typically high current components used in LC filters have parasitics at high frequencies that make it difficult to get high rejection at 6 GHz.

Figure 4:
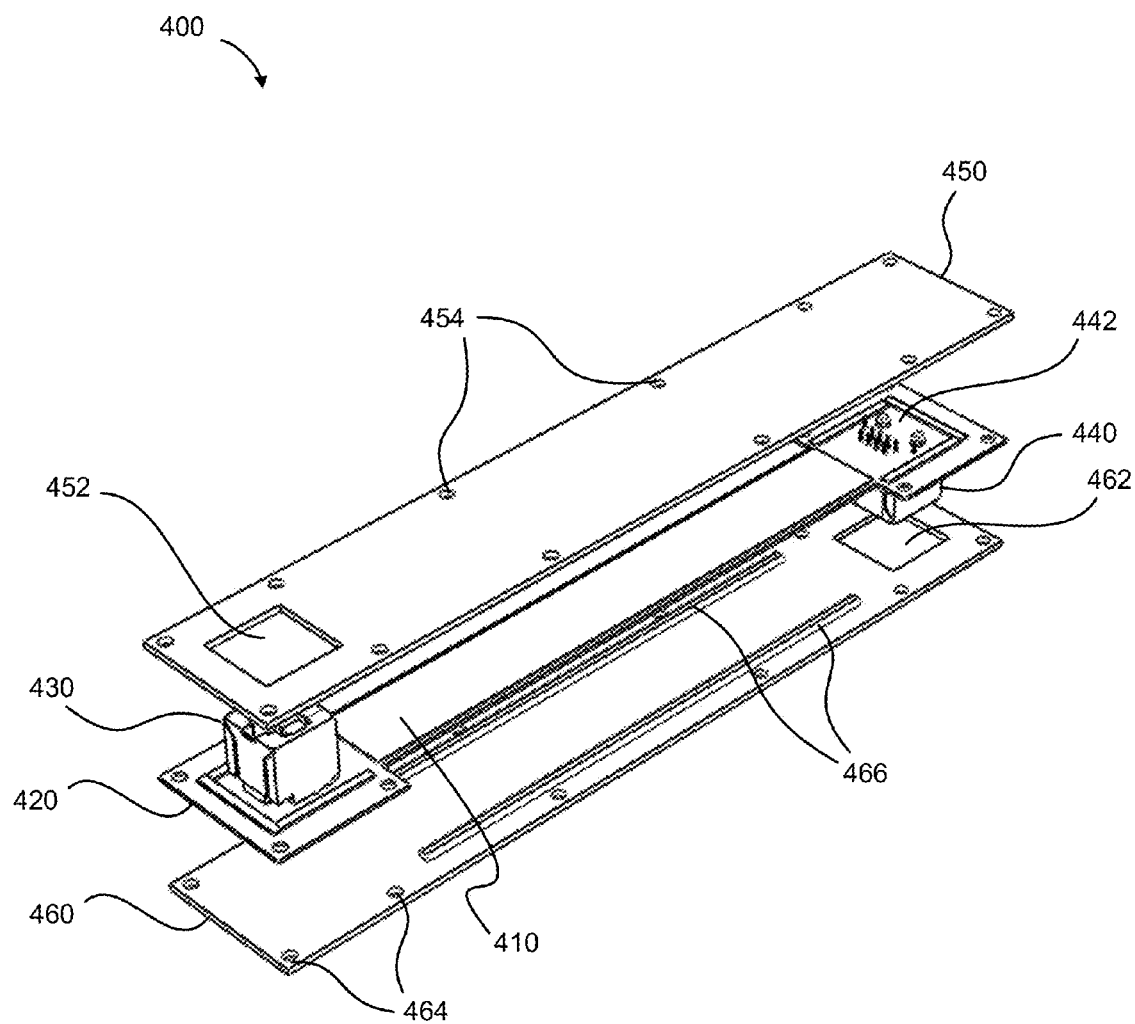
FIG. 4 illustrates an exemplary isometric perspective of a standard construction, in accordance with the present invention.

FIG. 4 illustrates an exemplary isometric perspective view of a passive filter assembly 400, according to an embodiment. Filter assembly 400 includes a filter strip 410 comprising a packed particulate or granular conducting substance as described above. The filter strip has desirable electrical characteristics and is used to selectively pass or impede by its configuration, dimensioning and composition, desired or undesired electrical signals. For example, the filter strip, combined with the other elements of filter 400 may allow for USB or Ethernet signals to pass, but blocks undesired leakage in the RF frequency range so that the data and/or control wiring does not disrupt or interfere with the operations of a RF test enclosure as described herein.

In its construction, the filter strip 410 is disposed on a rigid internal filter support plate, sheet or strip 420 that is substantially flat in some embodiments, and which provides mechanical support for the filter strip material 410, which itself may be soft or brittle. Connectors 430 and 440 are electrically coupled to the filter strip 410 so that the necessary signals (e.g., power, control) can be passed through filter strip 410, while blocking unwanted signal bands. The connectors 430 and 440 may be a matched pair that are consistent with a standard connector, interface or plug configuration specified by an industrial standard (e.g., IEEE, ITU specification). Therefore, the connectors 430, 440 will typically have a plurality of electrical connections 442 to provide the specified interfaces at either end of filter assembly 400.

The internal filter support plate 420 is preferably surrounded by isolating structures including for example an upper plate 450 and a lower plate 460, which "sandwich" the central or internal filter plate 420 and filter strip 410. Apertures 452 and 462 are devised and located in the upper plate 450 and lower plate 460, respectively, so that the connectors 430 and 440 may pass therethrough. The upper and lower plates 450, 460 may be made of a substance that aids in isolating the filter's interior components from external RF fields. Small holes 454 and 464 are provided in upper and lower plates 450, 460 so that the assembly 400 may be tightly secured using mechanical fasteners, e.g., machine screws.

A pair of electromagnetically-isolating gaskets 466, and in some embodiments, more such gasket material, is disposed on one or more faces of the plates 450, 410, 460 as needed to further aid in sealing the filter assembly and filter strip 410 from the external electromagnetic environment. In some embodiments, the gasket material 466 is applied substantially all the way around the interface between any two such plates (450, 410, 460) to allow for some spacing therebetween while not compromising the RF shielding characteristics of the assembly.

In another aspect, the entirety of the assembly 400 may itself be inserted into a surrounding electromagnetically-isolating, shielded, grounded housing. For example such a housing, as shown and described below, could provide structural support and integrity to the filter and would reduce or minimize the transmission of unwanted signals into or out of the filter assembly during operation.

Figure 5:
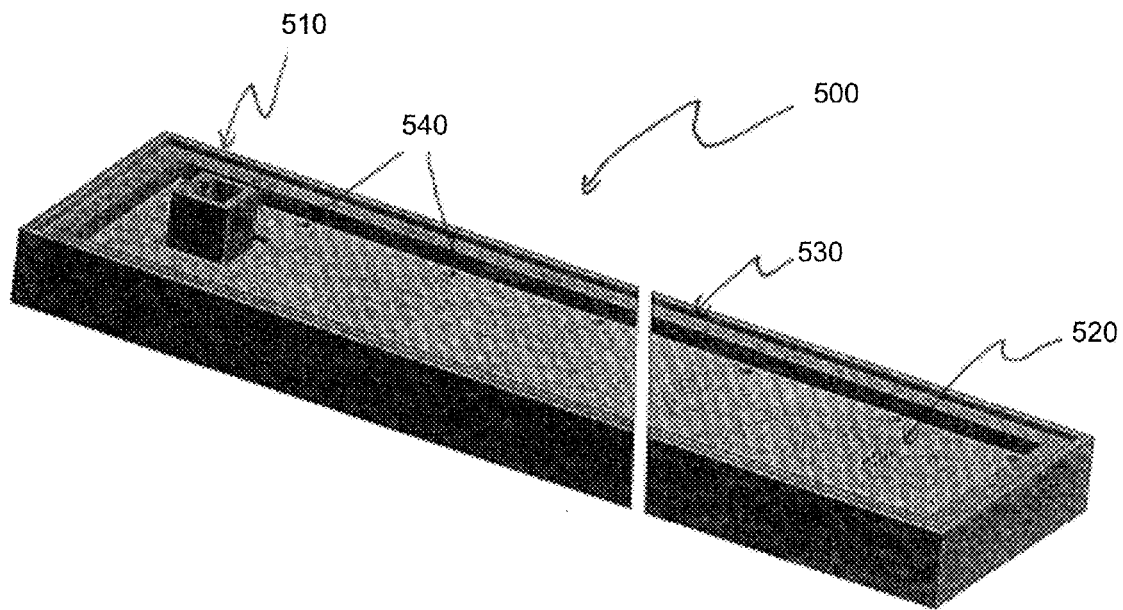
FIG. 5 illustrates an exemplary isometric perspective of an a near complete construction, in accordance with the present invention.

FIG. 5 illustrates an exemplary isometric perspective of an a near complete construction devoid of top plate, in accordance with the present invention, of passive filter module 500 comprised by base component 510, bevel/chamfer 530, pin layout 520 and screw holes 540 for secure construction.

Figure 6:
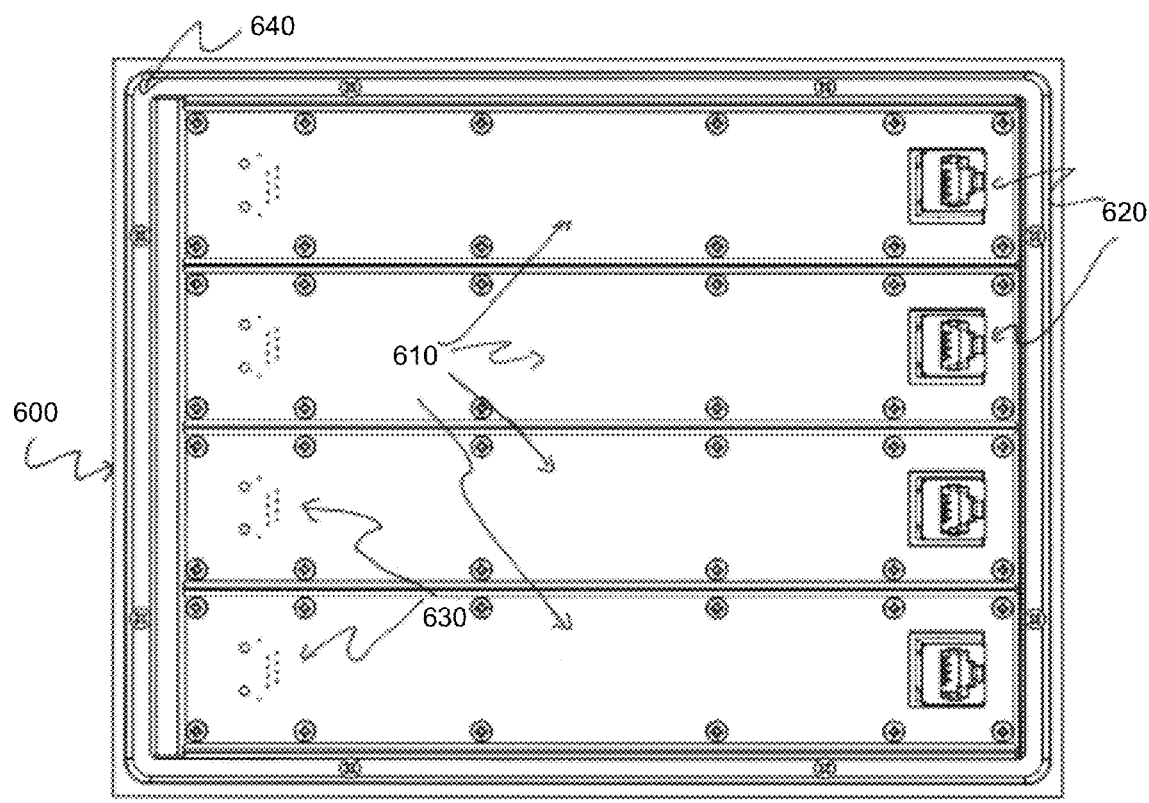
FIG. 6 illustrates an exemplary planer view of a multi-input modular array of electromagnetic isolation filters without a cover plate.

FIG. 6 illustrates an exemplary planer view of a multi-input modular array 600 of electromagnetic isolation filters without a cover plate. Multi-input modular array comprises passive filter modules 610 and frame structure 640. Frame structure can be made of any suitable rigid material (e.g., stainless steel, polymer, etc.) and contain an additional anechoic/electromagnetic absorptive material.

Referring to FIG. 6, Multi-input modular array contains a juxtaposition of four (4) passive filter modules 610 disposed alongside one another within the frame structure 640. However, it is not beyond the scope of the present invention to juxtapose any number of passive filter modules in any configuration. As depicted, passive filter modules 610 contain I/O interface ports 620. In the present embodiment, these are RJ-45 Ethernet jacks. In other embodiments, I/O interface ports 620 can be any suitable electromagnetic signal interface including, but not limited to, USB, HDMI, coaxial, or otherwise. Rear pin-outs 630 for corresponding I/O ports (not shown) can be observed at the distal end of each passive filter module 610.

Figure 7:
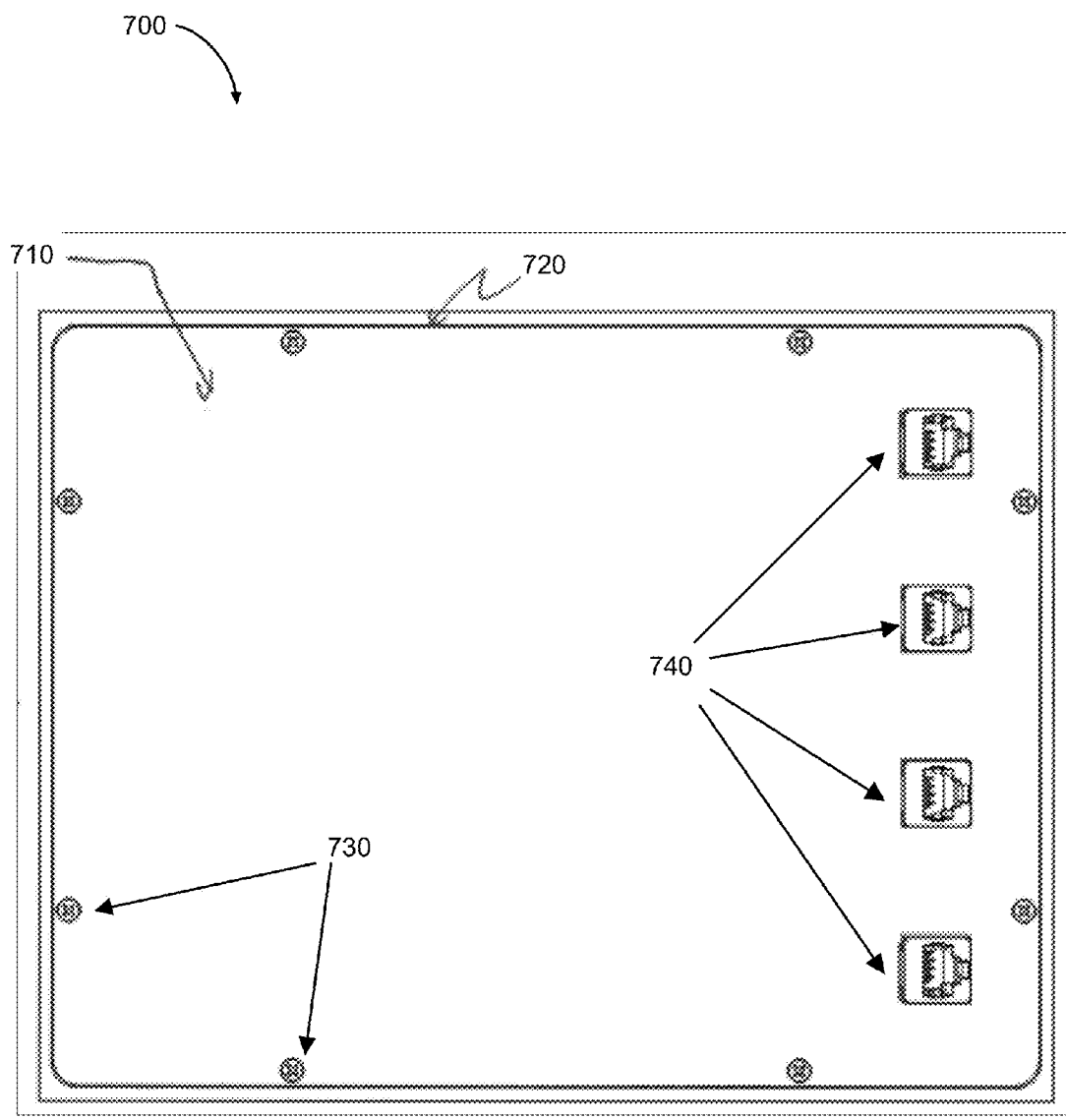
FIG. 7 illustrates an exemplary planer view of a multi-input modular array of electromagnetic isolation filters with cover plate.

FIG. 7 illustrates an exemplary planer view of a multi-input modular array of electromagnetic isolation filters 700 with cover plate 710. Multi-input modular array of electromagnetic isolation filters 700 comprises frame structure 720, cover plate 710, cover plate set screws 730, and I/O ports 740.

Frame structure 720 utilizes a beveled relief edge and set screws 730 for positioning securement of cover plate 710. Pursuant to frame structure 720 construction, cover plate 710 can be made of any suitable rigid electromagnetically isolating material (e.g., stainless steel, copper, aluminum, polymer, etc.) and contain an additional anechoic/electromagnetic absorptive material. Apertures afford passage of I/O ports 740 through cover plate 710 from individual passive isolation filters below, as described previously.

Figure 8:
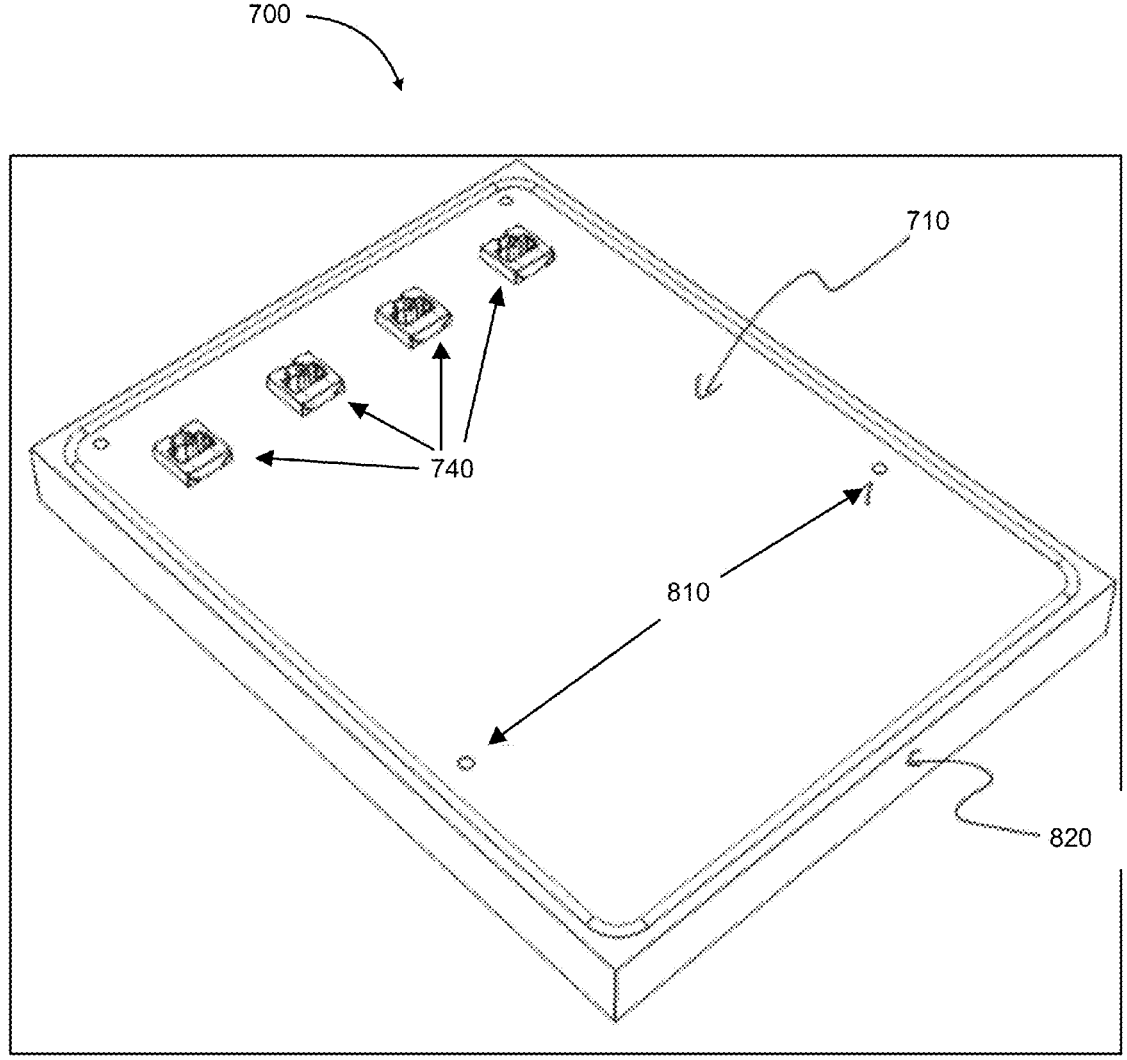
FIG. 8 illustrates an exemplary isometric perspective of a multi-input modular array of electromagnetic isolation filters.

FIGS. 7 and 8 illustrate an exemplary isometric perspective of a multi-input modular array of electromagnetic isolation filters 700, in accordance with the present embodiment depicted in FIG. 7. Referring to FIGS. 7 and 8, a multi-input modular array of electromagnetic isolation filters comprises a frame structure, cover plate, cover plate set screws holes to hold the plate in place, and a plurality of I/O ports.

The figures illustrate a frame structure 720 with a beveled relief edge and set screw holes 810, in conjunction with set screws 730, for positioning and securing cover plate 710. Set screw holes 810 are drilled apertures which allow mechanical coupling of set screws 730 to cover plate 710. Yet, any suitable fastening configuration and be used within the scope of the present invention.

Figure 9:
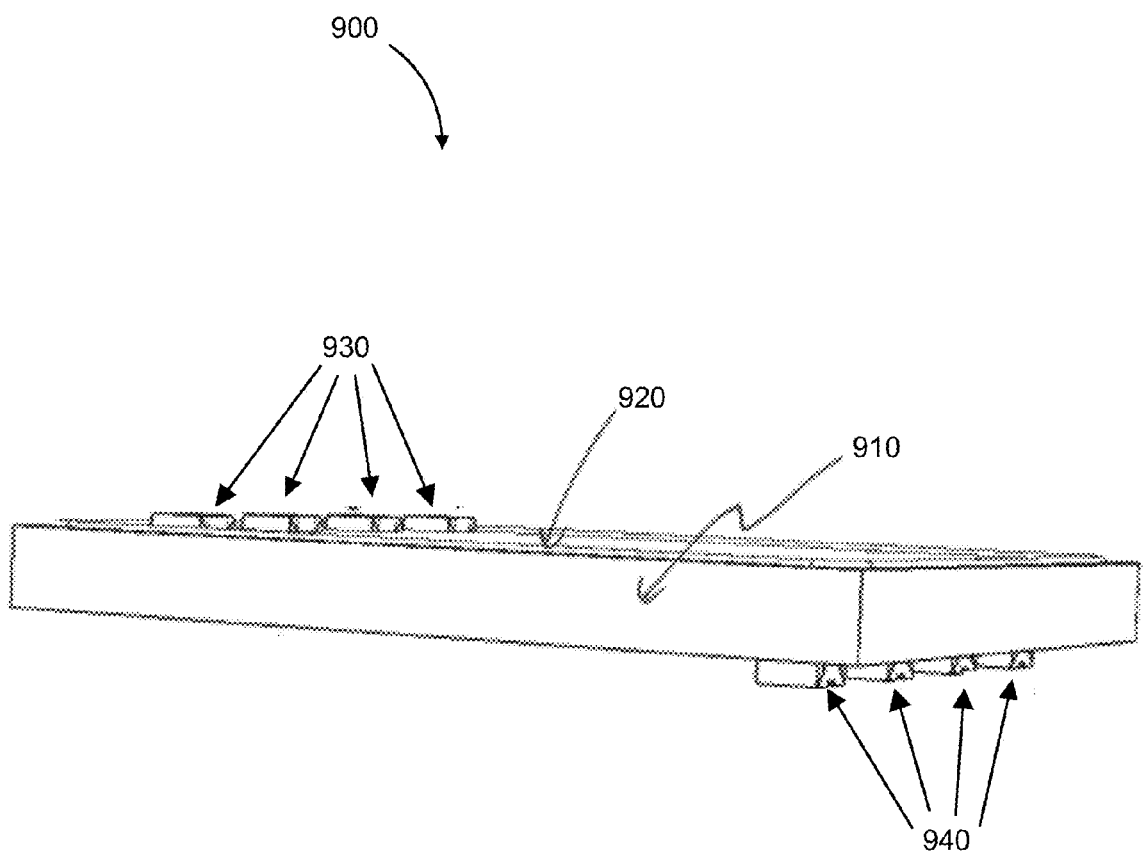
FIG. 9 illustrates an exemplary three-quarter side perspective of a multi-input modular array of electromagnetic isolation filters.

FIG. 9 illustrates an exemplary three-quarter side perspective of a multi-port modular array of electromagnetic isolation filters 900. Multi-port modular array of electromagnetic isolation filters 900 comprises frame structure 910, cover plate 920, I/O ports 930, and I/O ports 940. I/O ports 930, 940 are non-switched and bi-directional in the present embodiment. In other embodiments, I/O ports may be unidirectional, switched and/or routed within an embedded network.

Figure 10:
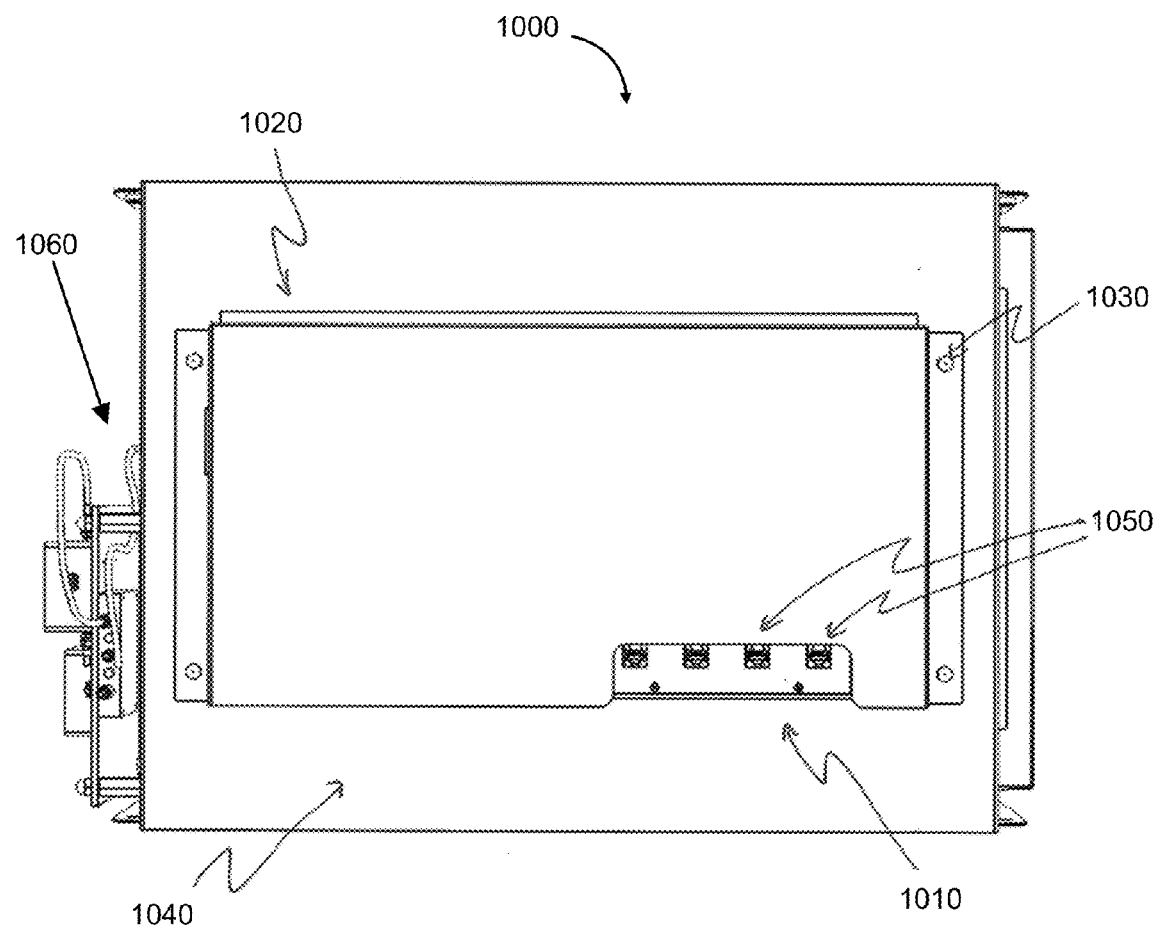
FIG. 10 illustrates an exemplary rear view of an isolation test enclosure with a multi-input modular array of electromagnetic isolation filters.

FIG. 10 illustrates an exemplary rear view of an isolation test enclosure 1000 with a multi-input modular array of electromagnetic isolation filters 1010. Other features include rear panel 1020 disposed on rear wall 1040 via bolts 1030 or other suitable means, such as rivets or wing nuts.

Multi-port modular array of electromagnetic isolation filters 1010 has electrical communication ports 1050 to be used for control or monitoring of device(s) within test enclosure 1000 cavity, as will be discussed in detail later in the present disclosure. Electrical communication ports 1050 in the present embodiment are Ethernet network RJ-45 and USB; however, it is not outside the scope of the present invention to be some other suitable connection, digital, analog, optical or otherwise. Isolation test enclosure 1000 also optionally incorporates an RF interface panel 1060 for manipulating electrical signals brought into the cavity of the isolation test enclosure 1000 to a device under testing (DUT), either directly, via conductive element, or indirectly, via over the air (OTA), visa vie, and antenna. The preceding will be discussed in greater detail later. The RF test signals are coupled into the enclosure via, e.g., barrel co-axial (SMA or N-) connectors that are mounted through the side wall of the enclosure. As stated before, the design and choice of connection type is generally not limiting to the nature of this invention and those skilled in the art will appreciate modification of a described or illustrated embodiment to accommodate other types of connections and RF test signals in the same scope of invention.

Figure 11:
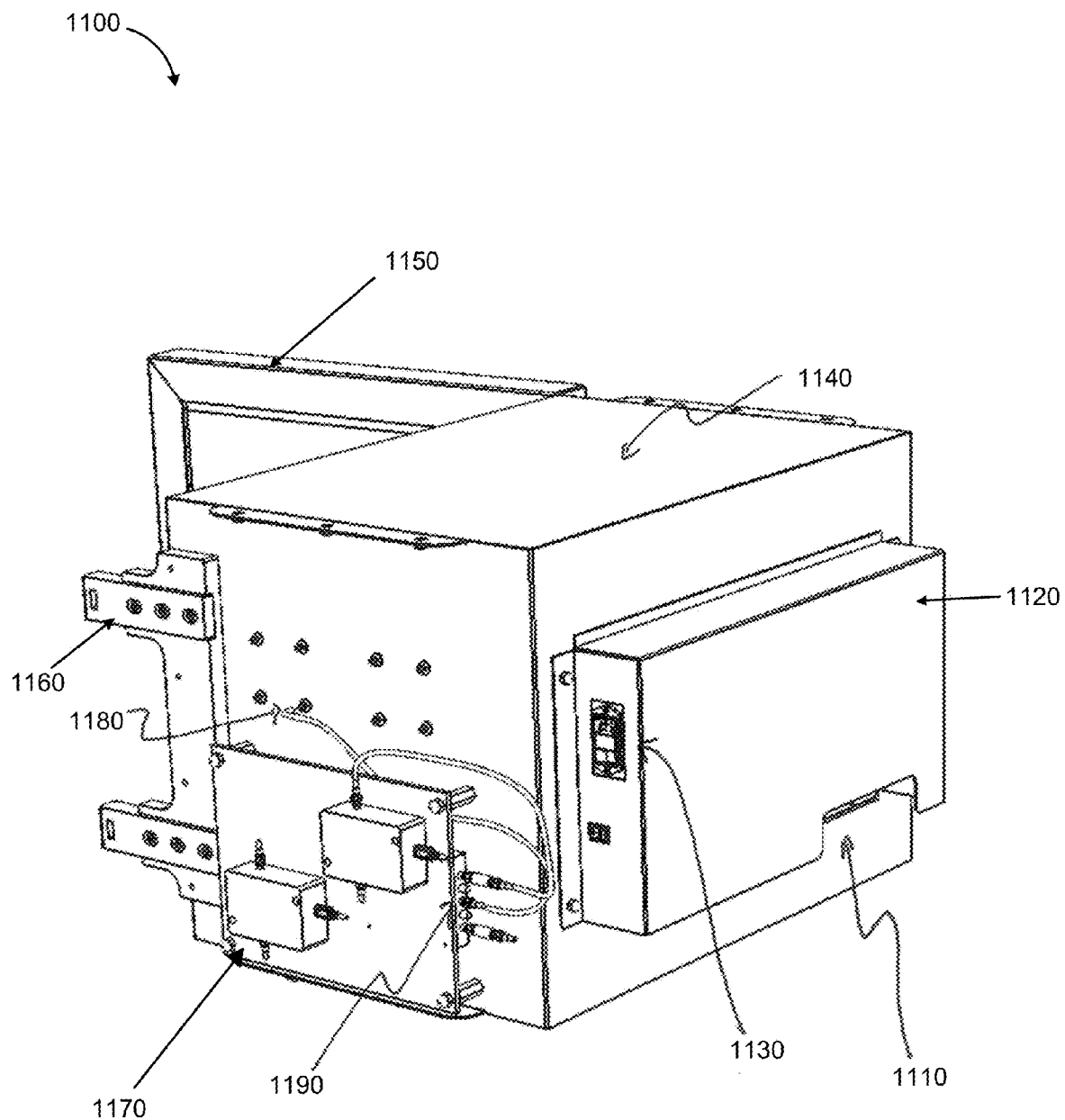
FIG. 11 illustrates an exemplary isometric rear perspective of an isolation test enclosure with a multi-input modular array of electromagnetic isolation filters.

FIG. 11 illustrates an exemplary isometric rear perspective of an isolation test enclosure 1100 with a multi-input modular array of electromagnetic isolation filters 1110. The cavity (depicted in proceeding figures), within which a DUT is typically disposed, is sealed by means of handle, latch, and bracket 1160. In the present embodiment, test enclosure 1100 includes a rear panel 1120 affixed hereto using bolt, rivets, wing nuts or other suitable means. Rear panel 1120 may have a standard power connection with suitable filter and on-off switch 1130.

The present systems can be used in conjunction with RF and other electromagnetic isolation test chambers such as those described by the present inventors in U.S. patent application Ser. No. 13/195,097, entitled "Electromagnetic Test Enclosure." The entire teaching of which is incorporated herein by reference.

Referring to FIG. 11, some primary components and connections are shown as would present to an operator testing a DUT in the present enclosure systems. Some components of the system are disposed within a the cavity of test chamber 1140, as will be described later, while other components are disposed on the exterior of test chamber 1140. Test chamber 1140 materials are preferably constructed of an electromagnetically shielding or opaque material such as steel or other high conductivity metal. In some embodiments a steel box forms the basis of the frame for each of the chambers. In other embodiments, any alloy, composite, or even semiconductor (e.g., with reverse bias over depletion zone) with readily available electrons in the valence shell may be used as basis of construction.

A controller is used in some embodiments to generate test signals to be delivered to the DUT by a test antenna, all elucidated and depicted later. Both the DUT and test antenna are located in the test chamber 1140. The test antenna also receives wireless signals from DUT so that a controller can record or operate on such signals received from the DUT.

In the instance of a bridge which relays data packets between an Ethernet port and a DUT antenna, signals to be is transmitted OTA by the DUT may be sent and received directly through networking connection disposed on the multi-port modular array of electromagnetic isolation filters 1110.

By way of full illustration of the operation of a shielded test enclosure as described herein, other components, including RF components may be employed in addition to those which are the focus of the present disclosure. For example, a RF feed-through connector panel 1170 is used to electrically couple the RF conducting cables 1180, 1190 from the interior to exterior. Analog or digital filters may be employed within the I/O panel 1170. Such additional filtering techniques may be useful in coupling RF circuitry used for testing in the present context to the DUT or other elements of the system. Generally, any openings, seams, joints, and other apertures where electromagnetic radiation may leak is electrically and/or mechanically secured and plugged or shielded to reduce unwanted interference and minimize errors in electromagnetic field measurements within the test enclosure.

Figure 12:
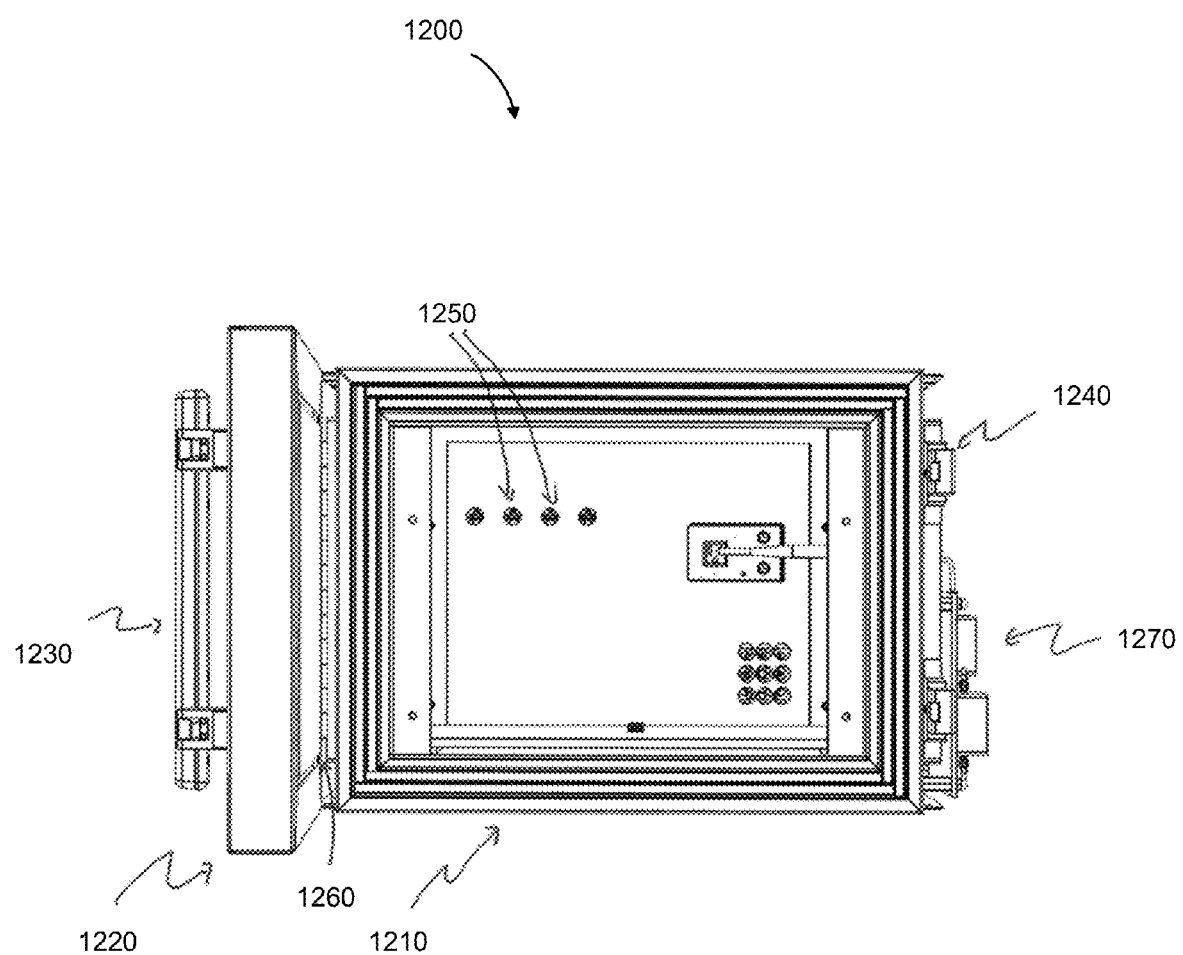
FIG. 12 illustrates an exemplary front view of an isolation test enclosure with a multi-input modular array of electromagnetic isolation filters.

FIG. 12 illustrates an exemplary front view of an isolation test enclosure 1200 with a multi-port modular array of electromagnetic isolation filters 1250. Test chamber 1210 includes an electromagnetic isolating door 1220 which is affixed to the test chamber housing 1210 by a hinge 1260. Hinge 1260 acts as a pivot point for the electromagnetic isolating door 1220 by which the interior of test chamber 1210 can be accessed using handle 1230. Electromagnetic isolating door 1220 is secured to the test chamber housing by latching mechanism 1230 and brackets 1240 which adhere said assembly to the test chamber housing. In some embodiments brackets 1240 may be bolted, welded, screwed, chemically bonded or other suitable adherence means to the test chamber housing 1210.

A plurality of test chambers can be arrayed in some embodiments. Stacking rails may be used to configure an array stack one on top of one another. In other embodiments within the scope of the present invention, arrays can be configured in a variety of arrangements, such as, side by side, front to back, etc. Sometimes, it is preferred to configure test chambers for the shortest electrical communication pathway, where RF module 1270, shown in proceeding figure, is disposed to vertically align with the RF module of a companion stacked test chamber.

Figure 13:
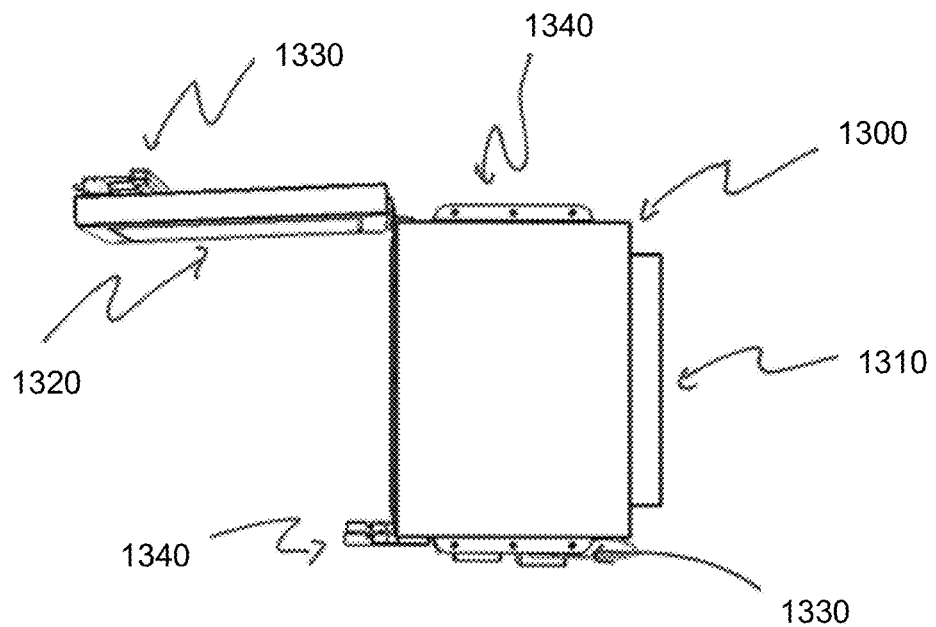
FIG. 13 illustrates an exemplary top view of an isolation test enclosure with a multi-input modular array of electromagnetic isolation filters.

FIG. 13 illustrates a top-down exemplary perspective of an isolation test enclosure 1300 with a multi-input modular array of electromagnetic isolation filters 1310. Attention is directed to stacking rails 1340 which are used to couple a plurality of test chambers. Stacking rails 1340 are implemented in one embodiment as strips metal affixed to the top and bottom of test chamber 1300 with drilled holes to be used to mechanically couple (that is, bolt) test chambers together. In some embodiments, stacking rails may be grommets, clamps, male/female coupling devices, or other suitable mechanical assembly.

Also shown in FIG. 13, as previously discussed, are handle 1330 used with latching mechanism 1340 to secure front door 1320. Right-side panel comprises RF I/O ports 1330 for passing electromagnetic signal into the antenna disposed within the test cavity chamber.

Figure 14:
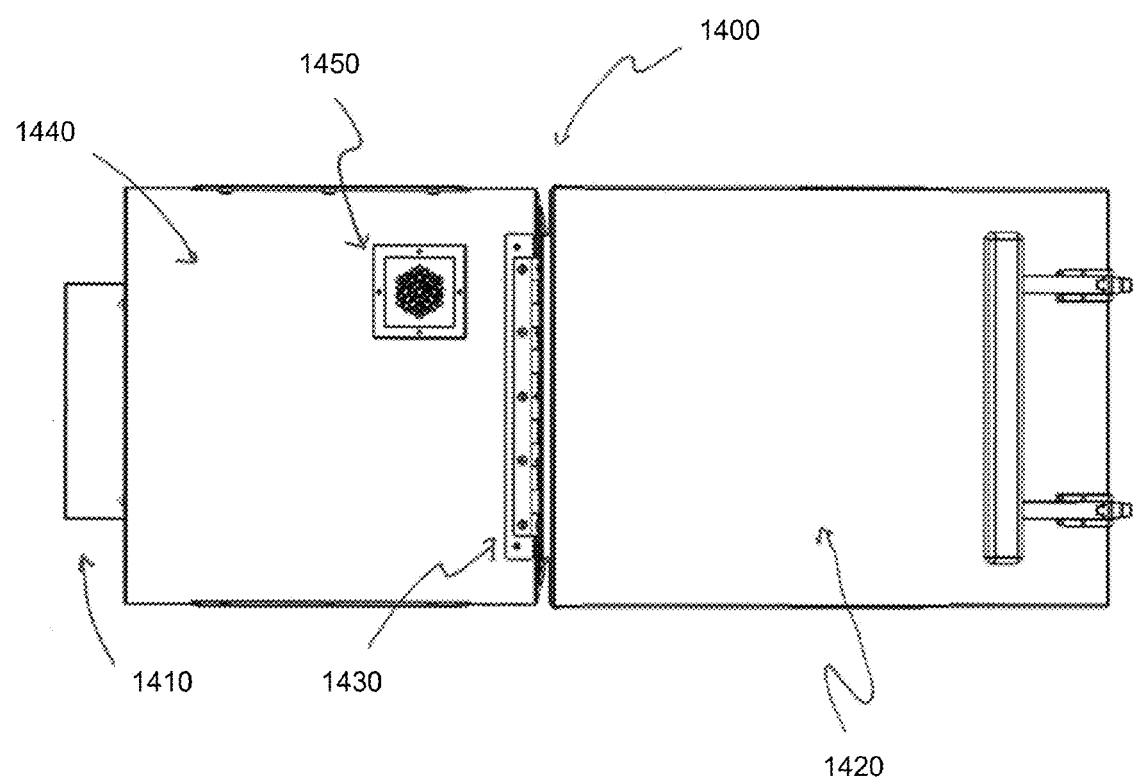
FIG. 14 illustrates an exemplary side view of an isolation test enclosure with a multi-input modular array of electromagnetic isolation filters.

FIG. 14 illustrates an exemplary left-side view of an isolation test enclosure 1400 with a rear panel 1410 containing a multi-input modular array of electromagnetic isolation filters. A right wall 1440 makes up, at least in part, test chamber 1400 in the present perspective. Said right wall 1440 is constructed with similar anechoic electromagnetically insulated material, as previously detailed.

In some embodiments, an outlet or exhaust vent 1450 for exhausting air from the chamber 1400 is provided in the wall of the chamber 1400. An intake fan 1460, shown and described below in alternate views, may be disposed on another wall of the chamber 1400, e.g., as illustrated further below. A screen or mesh may be employed to cover the air vent 1450 to attenuate wavelengths greater than half the diameter of mesh aperture size, pursuant to electromagnetic diffraction and faraday cage construction.

As previously enumerated, FIG. 14 references rear panel 1410, a hinge 1430 to affix test chamber door 1420. Rear panel 1410 also includes 110V grounded power connection and associated 60 Hz filter.

Figure 15:
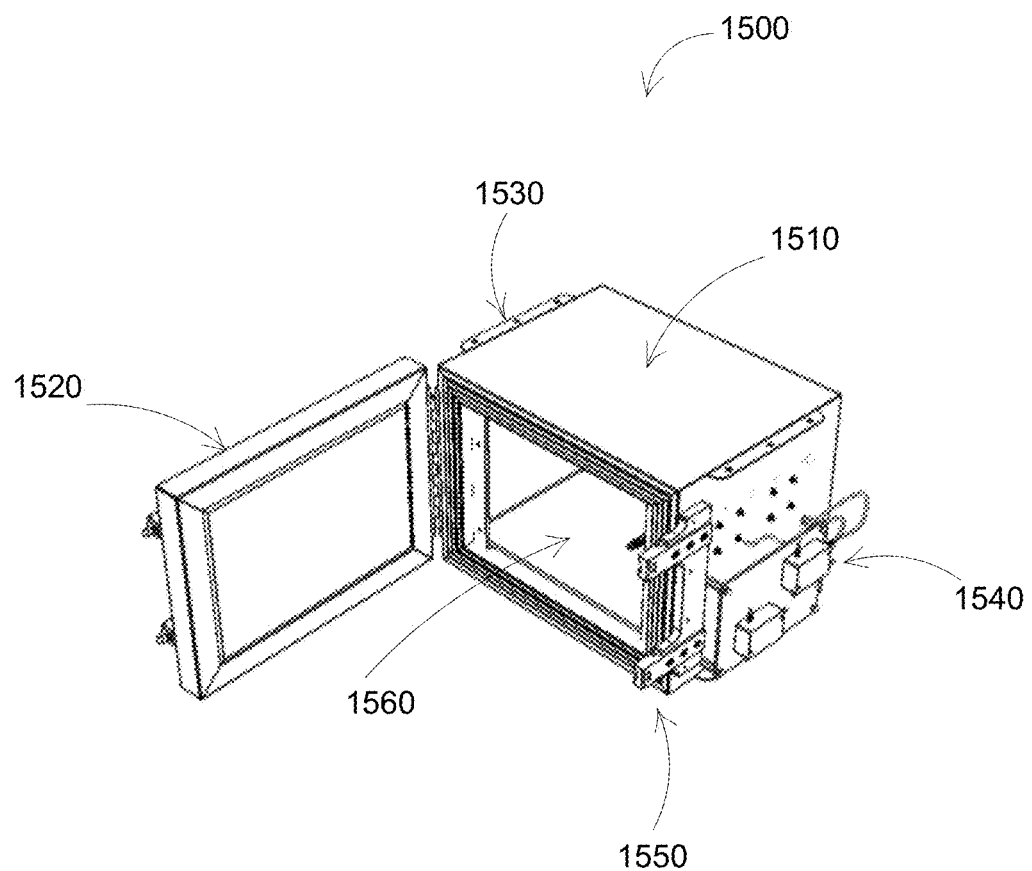
FIG. 15 illustrates an exemplary isometric front perspective of an isolation test enclosure with a multi-input modular array of electromagnetic isolation filters.

FIG. 15 illustrates an isometric front perspective of an exemplary isolation test enclosure 1500 1500. Optional RF module 1540 can hold programmable attenuators and combiners that are in some embodiments included to emulate a communication path loss, combine in noise or interference for testing the DUT signal to noise ratio (SNR) performance, or provide other functions relating to communication channel emulation. Electromagnetic test enclosure system is comprised by a housing 1510, which may be formed of one or more individual housing parts, and a door 1520. In the embodiment shown, the housing 1510 and door 1520 are mechanically coupled structures make up the enclosure space/cavity 1560 of the test enclosure system. Both coupled components, housing 1510 and door 1520, are made of walls that substantially isolate the electromagnetic environment on either side of said walls, and are constructed of electromagnetically opaque materials (e.g., metal, alloy, or other conducting solids such as steel in some embodiments). That is, an inside or internal volume is defined and an outside or external volume is defined by said walls.

In the present embodiment, this is performed by outer wall construction using a material with very high conductivity, sigma, with a thickness greater than the skin depth, delta, for a given electromagnetic wave. A material with an infinite conductivity reflects all electromagnetic waves impinge its surface, evanescence notwithstanding. In practice, the purpose of the highly conductive material prevents electromagnetic interference from entering the test chamber.

In an exemplary construction, one or more of the faces of the enclosure (e.g. a front face) generally has a door 1520 that can open and shut for access to the inside of the enclosure. The door or doors are made of electromagnetically opaque material (e.g., steel) are mounted to corresponding hinges, depicted later, that rotate on an axis to permit secure shutting of the doors and electromagnetic isolation of the internal environment volume when the doors are shut.

An operator (human or robot machine) may place the one or more DUT devices, not shown, into the enclosure comprised by the housing 1510. The door opening may be surrounded by a suitable electromagnetically-tight isolating strip, lip, bevel, chamfer, or gasket that prevents small amounts of radiation from leaking in or out of the areas surrounding the doors when shut. The tightness and isolating capabilities of the doors are further enhanced by the use of secure latches 1550 to hold the doors shut when testing is in progress. A warning light may indicate when testing is in progress so that an operator does not accidentally open the enclosure doors and defeat the isolating function thereof.

The doors of the enclosures of the present test system may swing open or shut on hinges as will be shown in later. Alternatively, the doors of the enclosures of the present system may slide on rails, slots, guides or other linear members so that the doors can open and shut securely to expose the interiors of the enclosures when the doors are open and isolate the interior volumes when the doors are shut. The door to a given enclosure may comprise only one panel or it may comprise a plurality (e.g., two) panels that cooperatively move together to open or shut the door to the enclosure. Still alternatively, a door to an enclosure may swing on a pivot upward and outward in a direction parallel to the face of the enclosure wall (fan-like), or in a direction perpendicular to the face of the enclosure wall (gull-wing door style). Accordion style doors, doors that move like those of a conventional garage door and other door styles are also possible for use with the proper materials and mechanical articulation elements as suits a given application.

Referring to FIG. 15, the housing 1510 is comprised by chamber roof, communication port wall 1540, another wall disposed distally from said communication port wall 1540, a rear wall disposed adjacent to same, and test chamber floor, as described later in the present application. All components comprising housing 1510 are made from anechoic and electromagnetic shielded/insulated materials. For proper securement of the test chamber door 1520, a robust handle is used in conjunction with latching mechanism 1550 which is fastened to housing via brackets. As will be discussed, test chamber are stacked in practice and secured together with fasteners 1530.

The test chamber cavity 1560 often holds an electromagnetic antenna, as described in more detail below, to be in electromagnetic communication over the air with the device under test (DUT). Sometimes a conducted line, coaxial cable, or other connection is used to bypass antennas and couple the RF test signal directly into the antenna port of the DUT. A DUT may be disposed in the test chamber cavity 1560 for over the air (OTA) coupling of the test signal and communication with test antenna.

In one or more present embodiments, a plurality of individual DUT devices may be placed in the test chamber. The plurality of individual DUT devices can include a plurality of identical device in the context of testing in production environments to increase the throughput of the production line testing.

While the a plurality of compartments or test chambers have been described as being vertically stacked one on top of the other, in another implementation, the test chambers may be disposed side-by-side, front-to-back, or in another reasonable configuration.

In basic operation, the system allows for wireless electromagnetic communication between a wireless component that can be controlled by a master device, either implemented in software or hardware, and in electrical communication with a device under test (DUT). Various DUTs may be interchangeably placed in the shielded space in the present enclosure and tested as to the performance of their wireless communication modules and features. This includes testing the multi-modal communication features or multiple-input-multiple-output (MIMO) features thereof.

One or more sensor test probes or antennas may be introduced into the test enclosure cavity 1560 to make measurements of the electromagnetic field at a location of the one or more test probes or antennas. In other embodiments, manual or automated translation and/or rotation or repositioning of any of the DUT or sensor probes or antennas can be used to map out a two- or three-dimensional representation of a characteristic (e.g., strength, intensity) of the electromagnetic field emanated by the DUT.

In some embodiments, the dimensions of the test chamber 1510 are kept relatively small and compact with respect to the wavelengths of the communication signals being tested in the chamber.

In other aspects, the present test system is one of a plurality of such test systems in a production line testing station. It can be seen that, especially given its compact nature, the present test enclosure can be placed side by side along with a number of such enclosures so that an operator can conduct testing on a first test system while another operator conducts testing on a second test system and so on to increase the throughput of the testing facility or station.

Figure 16:
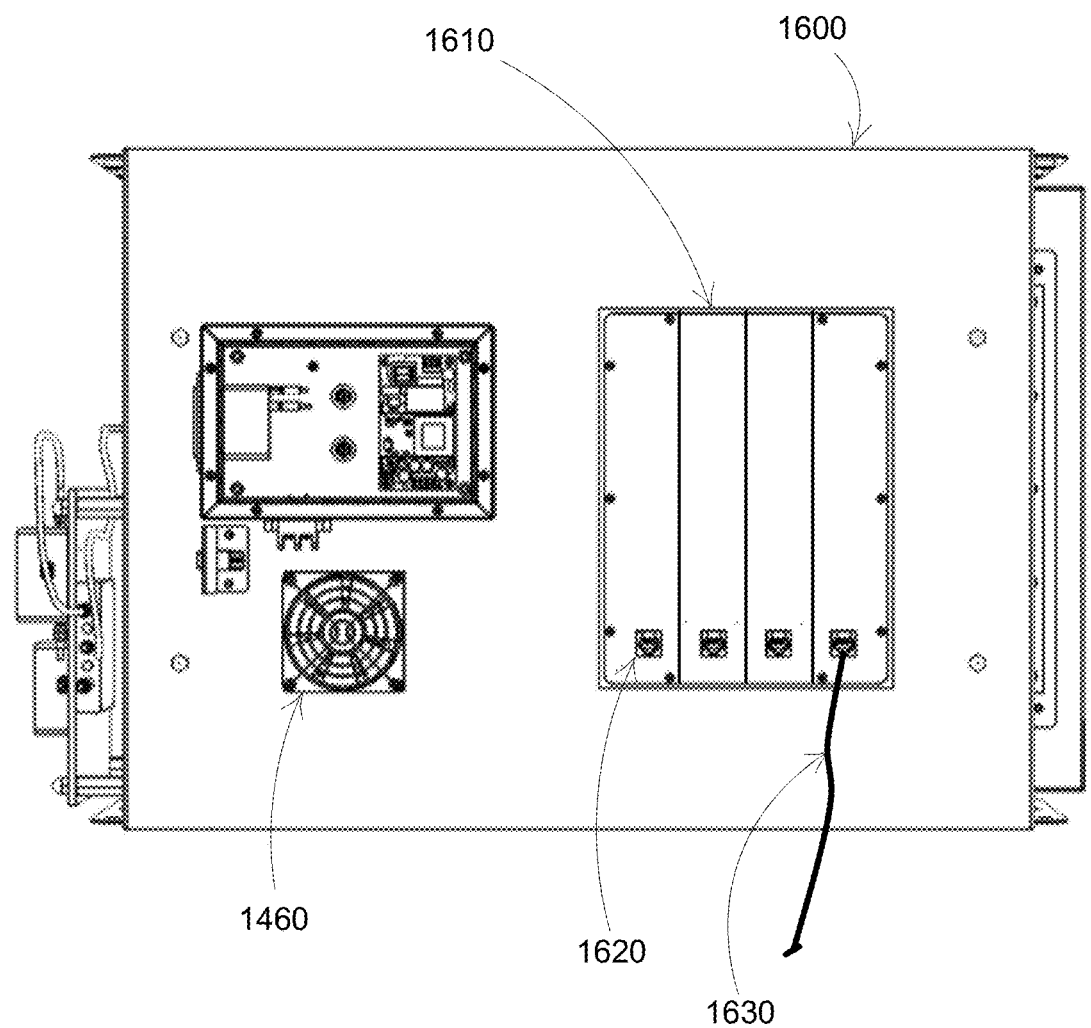
FIG. 16 depicts an exemplary isometric rear perspective of an isolation test enclosure with a multi-input modular array of electromagnetic isolation filters.

FIG. 16 depicts a rear perspective of an exemplary isolation test enclosure 1600 with a multi-input modular array of electromagnetic isolation filters 1610. Multi-input modular array of electromagnetic isolation filters 1610 comprises I/O ports 1620 for connecting network cables 1630 for the purposes of electrical communication.

The equipment within test chamber is electromagnetically isolated from the environment outside the chambers. Therefore, cables or conducting lines such as network and power lines enter the chamber through the filter modules 1610.

Specifically, in one embodiment, a coupling panel may be installed a wall of the test chamber 1600. The coupling panel may have a first face proximal to or facing inward towards the interior of the chamber and a second face proximal to or facing outwards towards the exterior of the chamber. Suitable connection points, plugs, jacks, or terminator connectors are built into the inner and the outer faces of the coupling panel. Separate conducting or fiber lines or cables can be then connected to respective terminator connectors on the respective first and second faces of the coupling panel to establish communication between the inside and the outside of the chamber without directly passing a wire or line through the walls of the chamber.

To best isolate the components within test chamber 1600 yet allow hard wired signaling therebetween, data cables are coupled into the test chamber via feed-through filters. Furthermore, to avoid leakage of unwanted or extraneous signals into the shielded test environs, the couplings are adequately shielded and filtered.

In an embodiment, a DUT and interior antenna are in RF communication within the test chamber 1600. RF barrel or I/O connector panel 1610 is used to electrically couple the conducting cables between the interior and exterior. In this manner, unsuitable frequencies may be eliminated using constructed filters (e.g., low/high pass, notch, etc). All openings, seams, joints, and other apertures where electromagnetic radiation may leak are electrically and/or mechanically secured and plugged or shielded to reduce unwanted interference and minimize errors in electromagnetic field measurements within the test enclosure. An electrical fan 1460 induces fresh air into the interior of chamber 1600. Air circulates in the chamber and exits via an air outlet. Both air inlet at the fan and outlet placed elsewhere on the chamber wall are covered by waveguide structures that suppress RF frequencies that can interfere with the test.

Figure 17:
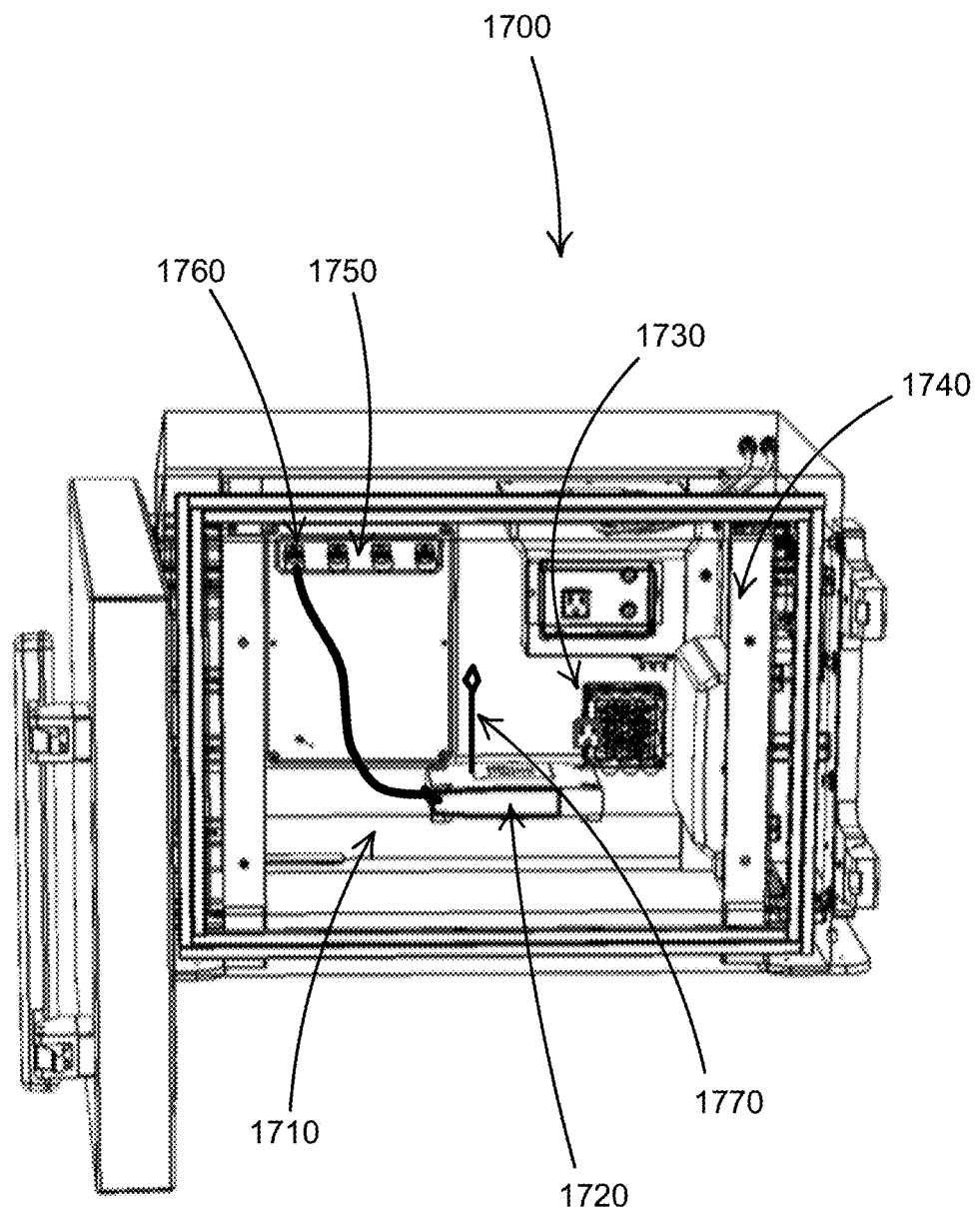
FIG. 17 depicts an exemplary isometric front perspective of an isolation test enclosure with a multi-input modular array of electromagnetic isolation filters.

FIG. 17 depicts an isometric front perspective of an exemplary isolation test enclosure 1700 with a multi-input modular array of electromagnetic isolation filters 1750. The cavity 1710, within which a DUT is typically disposed, is sealed by means of handle, latch, and bracket, as previously described.

Referring to FIG. 17, some primary components and connections are shown as would present to an operator testing a DUT in the present enclosure systems. Some components of the system are disposed within a cavity 1710 of test chamber 1700, while other components are disposed on the exterior of test chamber 1700. As stated before, test chamber 1700 materials are preferably constructed of an electromagnetically shielding or opaque material such as steel or other high conductivity metal. In some embodiments a steel or aluminum box forms the basis of the frame for each of the chambers. In other embodiments, any alloy, composite, or even semiconductor (e.g., with reverse bias over depletion zone) with readily available electrons in the valence shell may be used as basis of construction.

A controller is used to generate test or control signals to be delivered to the DUT 1720 via a filtered data line connected through the multi-input modular array of electromagnetic isolation filters 1750. The DUT 1720, located in the test chamber 1700, transmits and receives test traffic via its DUT antenna 1770.

Over the air (OTA) communication is effected through the interior I/O RF panel 1740 whereby an antenna may be affixed. In the present embodiment, a cooling/circulatory port 1730 is disposed in the rear wall of the test chamber 1700.

Figure 18:
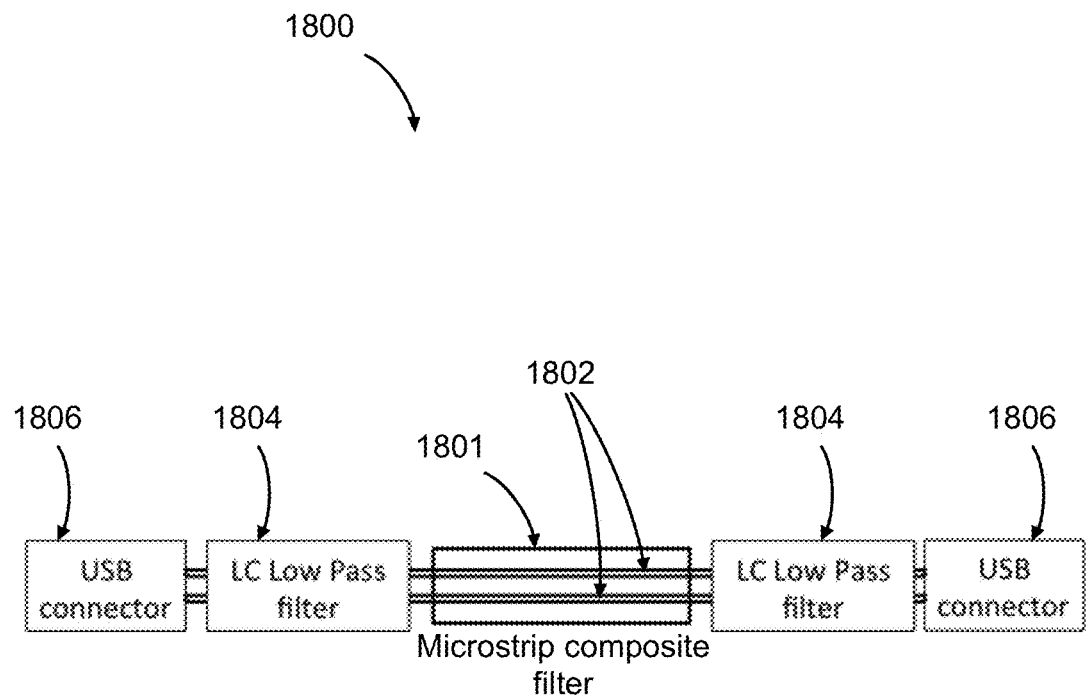
FIG. 18 illustrates a simplified electrical arrangement of a composite microstrip plus LC filter apparatus according to an embodiment.

FIG. 18 illustrates an exemplary simplified electrical arrangement of a microstrip composite filter device 1800 as described above. The filter device 1800 further includes a pair of inductive-capacitive (LC) filter elements 1804 coupled to conducting transmission lines 1802, which are embedded in the composite microstrip portion 1801 of the filter as described earlier. The filter 1800 furthermore includes a pair of termination points or connectors 1806, which may be USB type connectors, but the present invention is not limited by this type of connector as would be appreciated by those skilled in the art. In some embodiments, such a system comprising the composite microstrip filter element 1801 and low pass filter elements 1804 provides an improved (e.g., sharpened roll-off) filtering characteristic. In some applications, this sharpened electrical response of the filter 1800 is useful in USB connections into and out of the RF isolation chambers described herein.

Figure 19:
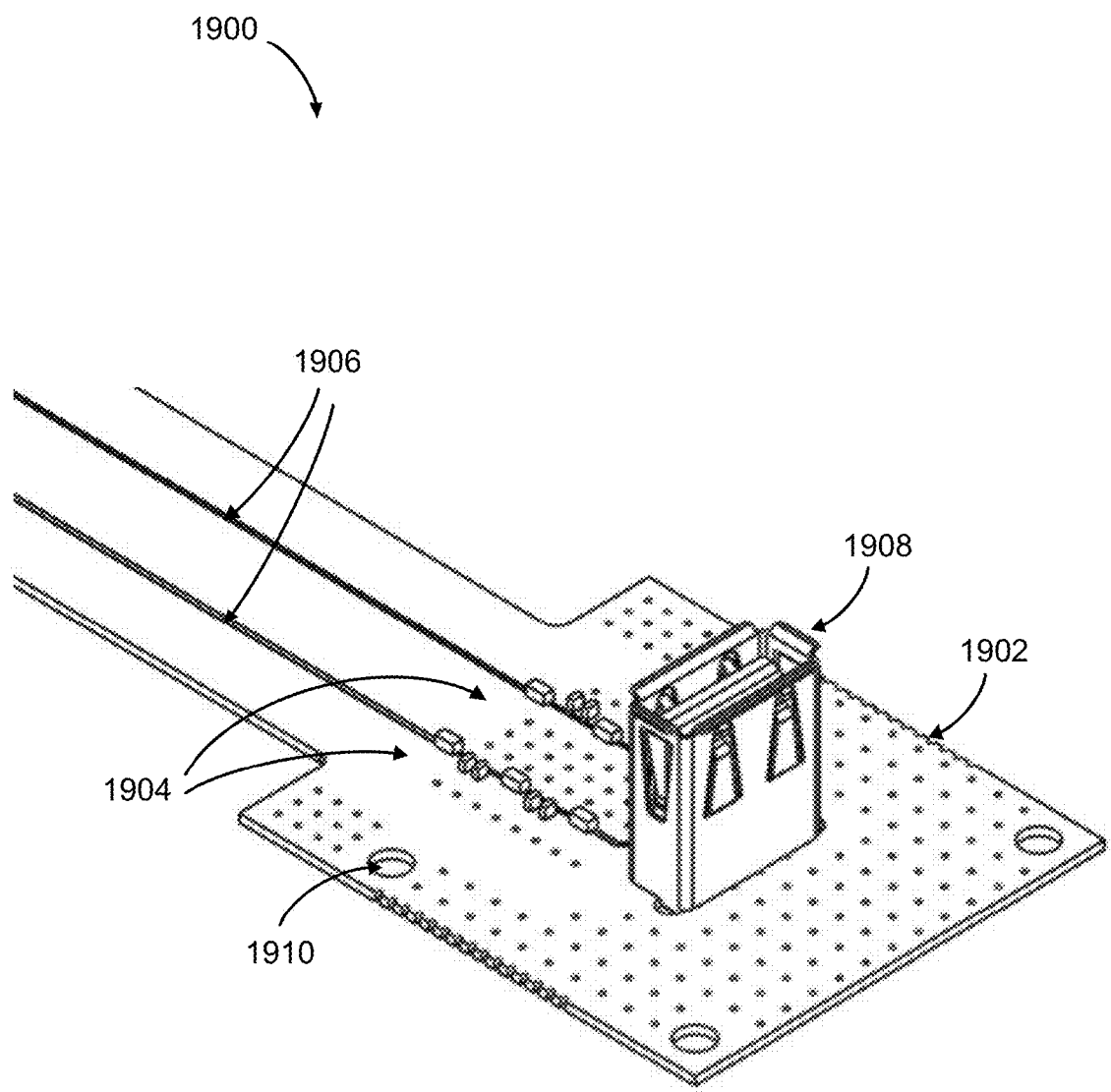
FIG. 19 illustrates an exemplary physical arrangement of a composite microstrip plus LC filter assembly with and USB connectors.

FIG. 19 illustrates an embodiment of a part of a filter assembly 1900. The filter includes a support plate 1902, which may be sandwiched between electrically isolating layers as described, and may include a pair of conducting transmission lines 1906 embedded within a filtering medium such as a composite filter medium as described earlier. In addition, the filter includes a pair of LC filter elements 1904 on either one of the conducting transmission lines 1906. The LC filters 1904 provide a desired or an additional filtering capability to the overall device, for example sharpening its roll-off characteristic to make the filter more suited for USB signaling while rejecting other (e.g., 700 MHz) frequencies that may be used for wireless test signals. Electrically, the LC components 1904 are disposed in series with the filter medium enclosing transmission lines 1906. A USB connector or termination point 1908 is shown by way of example. The figure shows an exemplary first end of a two-ended filter apparatus, the other end of which is constructed similar to the end shown in 1900. The USB endpoint connectors 1908 would be accessible from outside a housing of such a filter apparatus and suited for mating to corresponding USB connectors extending into a RF isolation test box on one end and extending to an outside connection on the other end.

FIG. 20 illustrates an electrical schematic of a filter 2000 according to the present disclosure. The circuit comprises a pair of electrical termination connectors, here USB type connections 2020 and 2022, at either end of the filter 2000. An absorbing, attenuating or shielding medium in the form of a composite strip as described earlier is disposed at 2002 about the main conducting transmission lines 2050, 2052.

LC filter elements 2008 and 2040 are disposed upstream and downstream of composite filter medium 2002 in line with conducting transmission line 2052 and 2050, and similarly, LC filter elements 2034 and 2028 electrically surround conducting transmission lines 2052 and 2050 as they lie in composite filter medium 2002. Further inductive elements (e.g., 2042) may be installed in series or cooperation with LC filter elements (e.g., 2040). Ground lines 2041, 2010, source power supply lines 2014, 2026, and data lines 2024, 2043, 2012 and 2016 run through the length of filter 2000, sandwiched or embedded in RF isolating composite filter medium 2002 as described and shown earlier. The power loop may be protected by resistive fuses 2030 and 2004 and bypassed by capacitors 2032 and 2006.

Additionally within the scope of the present invention, analog or digital filters may be employed within the I/O panels. In this manner, unsuitable frequencies may eliminated using constructed filters (e.g., low/high pass, notch, etc.), as is known in the art. All openings, seams, joints, and other apertures where electromagnetic radiation may leak are electrically and/or mechanically secured and plugged or shielded to reduce unwanted interference and minimize errors in electromagnetic field measurements within the passive filter modules.

Electrical communication ports in the present embodiment are disclosed; however, it is not outside the scope of the present invention to be some other suitable connection, digital, analog, optical or otherwise. Electrical communication from and to the electromagnetically isolated passive filter modules is executed by RF coaxial cabling with SMA connectors. In practice, any suitable conduction apparatus can be used, preferably with shielding and field termination geometries.

The present invention should not be considered limited to the particular embodiments described above, but rather should be understood to cover all aspects of the invention as fairly set out in the attached claims. Various modifications, equivalent processes, as well as numerous structures to which the present invention may be applicable, will be readily apparent to those skilled in the art to which the present invention is directed upon review of the present disclosure. The proceeding enumeration of embodiments are intended to cover such modifications and equivalents.

What is claimed is:

1. An apparatus for mitigating electromagnetic interference, comprising:
   a first strip of passive electromagnetically attenuating media;
   a second strip of passive electromagnetically attenuating media; and
   one or more electrical conductors extending substantially along a length of the first and second strip;
   said one or more electrical conductors disposed in between first and second strip;

one or more electromagnetic signal interface ports, said electromagnetic signal interface ports in electrical communication with said one or more electrical conductors; and a LC filter element in-line with said electrical conductors so as to sharpen the filter drop-off characteristic of the apparatus.

2. The apparatus of claim 1, said first and second strips comprising lossy media in a composite medium.

3. The apparatus of claim 1, said first and second strips disposed in close proximity to said one or more electrical conductors thereby creating an electromagnetically-isolating envelope.

4. The apparatus of claim 1, said first and second strips further comprising a media with a complex permeability, p.

5. The apparatus of claim 1, said electromagnetic signal interface ports comprising a standard networking protocol standard.

6. The apparatus of claim 1, said electromagnetic signal interface ports comprising a standard coaxial protocol standard.

7. The apparatus of claim 1, said electromagnetic signal interface ports in electrical communication with a device under test.

8. The apparatus of claim 1, further comprising one or more of said apparatus for mitigating electromagnetic interference thereby engendering an array.

9. The apparatus of claim 8, further comprising a test chamber, said array mechanically coupled to said test chamber.

10. The apparatus of claim 1, said electrical conductors comprising metal traces.

11. The apparatus of claim 1, said electrical conductors comprising copper wires.

12. The apparatus of claim 1, further comprising a solid conduit through which said electrical conductors pass.

13. The apparatus of claim 1, said apparatus being formed by a monolithic electromagnetically-isolating box into using an electromagnetically-isolating material.

14. The apparatus of claim 1, comprising a plurality of connectors for controlling a test of a plurality of different wireless communication devices under.

15. In an electromagnetically isolating test chamber system, a passive electromagnetic filter assembly that attenuates unwanted electromagnetic interference at or proximal to a portal penetrating into said test chamber, the filter assembly comprising:
   a housing, including mechanical mounting points for mounting to the electromagnetic test chamber, and including at least a pair of apertures penetrating said housing;
   an electrical signal conductor, having a first end and a second end, that carries desired electrical signals along a length of said conductor between the first end of the signal conductor to the second end of the signal conductor;
   an electromagnetically-attenuating medium, comprising a composite of conducting particles embedded in a flexible substrate, substantially surrounding the signal conductor and substantially extending the length of said signal conductor between said first and second ends thereof; and
   a pair of electrical connectors, one at each end of said signal conductor, a first one of said connectors proximal to a first aperture in said housing and a second one of said connectors proximal to a second aperture in said housing;
   wherein said connectors are dimensioned, shaped and configured according to a standardized commercial specification and further adapted for mating to corresponding connectors according to said standardized commercial specification; and
   wherein said first housing aperture and first connector are suitably disposed on said housing to be in signal communication with components inside the test chamber, while said second housing aperture and second connector are suitably disposed on said housing to be in signal communication with components outside said test chamber, the filter assembly thereby being configured and arranged to provide selective signal passage through said conductor and said connectors, and to exclude unwanted electromagnetic interference from passing therethrough.

16. The assembly of claim 15, said signal conductor comprising a plurality of bundled conducting wires, the signal conductor terminating at either end thereof in said electrical connectors, the connectors and the plurality of bundled conducting wires being coupled at the respective ends of the wires to conform to said standardized commercial specification.

17. The assembly of claim 16, said specification comprising an Ethernet or a USB specification.

18. The assembly of claim 15, further comprising a LC filter element in-line with said signal conductor so as to sharpen the filter drop-off characteristic of the assembly.

19. A passive electromagnetic filter assembly, comprising:
   a housing having at least a pair of apertures penetrating said housing;
   a filter support plate to support one or more passive filter components comprising a substantially planar plate supporting a pair of electrical connectors, one proximal to each of two opposing ends of said filter support plate, and supporting an electrical signal conductor;
   an electromagnetically-attenuating medium, comprising a composite of conducting particles embedded in a flexible substrate, disposed around the signal conductor but permitting the signal conductor to be coupled at respective opposing ends thereof to respective ones of said pair of electrical connectors; and
   a first isolation plate comprising a solid electromagnetically isolating slab disposed proximal to a first face of said filter support plate and including a first aperture for passage of a first of said pair of electrical connectors therethrough; and
   a second isolation plate comprising a solid electromagnetically isolating slab disposed proximal to a second face of said filter support plate, opposing the first face of said filter support plate, and including a second aperture for passage of a second of said pair of electrical connectors therethrough.

20. The assembly of claim 19, said first and second isolation plates configured and arranged to securely sandwich said filter support plate between them to substantially form a three-layered assembly having the passive filter components therein.

21. The assembly of claim 20, further comprising an electromagnetically isolating gasket surrounding at least a portion of said passive filter components and disposed between the respective isolation plates and the filter support plate.

22. The assembly of claim 19, further comprising an outer housing that substantially encloses other components of the assembly, and having at least one opening therein to permit signal communication between the passive filter components in the assembly and other systems outside the assembly.

23. The assembly of claim 19, said filter support plate supporting a second passive filter component comprising a second signal conductor within a second electromagnetically-attenuating medium, said second signal conductor coupled at its ends to a second pair of electrical connectors.

24. The assembly of claim 19, further comprising a LC filter element in-line with said signal conductor so as to sharpen the filter drop-off characteristic of the assembly.

\* \* \* \* \*